US009819151B2

(12) United States Patent
Santis et al.

(10) Patent No.: US 9,819,151 B2
(45) Date of Patent: Nov. 14, 2017

(54) HIGH-COHERENCE SEMICONDUCTOR LIGHT SOURCES

(71) Applicant: CALIFORNIA INSTITUTE OF TECHNOLOGY, Pasadena, CA (US)

(72) Inventors: Christos T Santis, Pasadena, CA (US); Scott T Steger, Pasadena, CA (US); Amnon Yariv, Pasadena, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 0 days.

(21) Appl. No.: 14/319,466

(22) Filed: Jun. 30, 2014

(65) Prior Publication Data

US 2015/0333480 A1 Nov. 19, 2015

Related U.S. Application Data

(60) Provisional application No. 61/842,770, filed on Jul. 3, 2013.

(51) Int. Cl.
*H01S 5/12* (2006.01)
*H01S 5/30* (2006.01)
(Continued)

(52) U.S. Cl.
CPC ............. *H01S 5/12* (2013.01); *H01S 5/021* (2013.01); *H01S 5/1032* (2013.01); *H01S 5/2231* (2013.01); *H01S 5/3013* (2013.01); *H01S 5/3031* (2013.01); *H01S 5/0224* (2013.01); *H01S 5/02272* (2013.01); *H01S 5/02415* (2013.01); *H01S 5/1203* (2013.01); (Continued)

(58) Field of Classification Search
CPC .......... H01S 5/021; H01S 5/0218; H01S 5/12
See application file for complete search history.

(56) References Cited

U.S. PATENT DOCUMENTS 6,151,343 A * 11/2000 Jurgensen ............. G03F 7/2053
372/38.02
7,418,166 B1 8/2008 Kapur et al.
(Continued)

OTHER PUBLICATIONS

"Q factor" (RP Photonics webpage, capture date Mar. 7, 2007).*
(Continued)

*Primary Examiner* — Tod T Van Roy
(74) *Attorney, Agent, or Firm* — Steinfl + Bruno LLP

(57) ABSTRACT

A laser resonator includes an active material, which amplifies light associated with an optical gain of the resonator, and passive materials disposed in proximity with the active material. The resonator oscillates over one or more optical modes, each of which corresponds to a particular spatial energy distribution and resonant frequency. Based on a characteristic of the passive materials, for the particular spatial energy distribution corresponding to at least one of the optical modes, a preponderant portion of optical energy is distributed apart from the active material. The passive materials may include a low loss material, which stores the preponderant optical energy portion distributed apart from the active material, and a buffer material disposed between the low loss material and the active material, which controls a ratio of the optical energy stored in the low loss material to a portion of the optical energy in the active material.

31 Claims, 17 Drawing Sheets

(51) Int. Cl.

| | |
|---|---|
| *H01S 5/02* | (2006.01) |
| *H01S 5/10* | (2006.01) |
| *H01S 5/223* | (2006.01) |
| *H01S 5/022* | (2006.01) |
| *H01S 5/024* | (2006.01) |
| *H01S 5/343* | (2006.01) |
| *H01S 5/20* | (2006.01) |
| *H01S 5/22* | (2006.01) |

(52) U.S. Cl.
CPC ........... *H01S 5/2063* (2013.01); *H01S 5/2224* (2013.01); *H01S 5/34306* (2013.01); *H01S 2301/02* (2013.01); *H01S 2301/163* (2013.01)

(56) References Cited

U.S. PATENT DOCUMENTS

| 7,528,403 | B1 | 5/2009 | Borselli et al. | |
|---|---|---|---|---|
| 2004/0109483 | A1 | 6/2004 | Simpson et al. | |
| 2004/0150043 | A1 | 8/2004 | Holm et al. | |
| 2010/0142580 | A1* | 6/2010 | Gilet | H01S 5/026 372/50.11 |
| 2010/0246617 | A1* | 9/2010 | Jones | G02B 6/124 372/26 |
| 2010/0278206 | A1 | 11/2010 | Eberl et al. | |
| 2011/0299561 | A1* | 12/2011 | Akiyama | H01S 5/02248 372/50.11 |
| 2012/0106582 | A1 | 5/2012 | Herden et al. | |
| 2013/0107901 | A1* | 5/2013 | Deppe | G02B 6/12004 372/36 |
| 2013/0259077 | A1* | 10/2013 | Ben Bakir | G02B 6/12004 372/44.01 |

OTHER PUBLICATIONS

E. Ip, A. P. T. Lau, D. J. F. Barros, and J. M. Kahn, "Coherent detection in optical fiber systems," *Optics Express*, vol. 16, pp. 753-791, 2008.
K. Numata, J. Camp, M. A. Krainak, and L. Stolpner, "Performance of planar-waveguide external cavity laser for precision measurements," *Optics Express*, vol. 18, pp. 22781-22788, Oct. 25, 2010.
R. W. P. Drever, J. L. Hall, F. V. Kowalski, J. Hough, G. M. Ford, A. J. Munley, and H. Ward, "Laser Phase and Frequency Stabilization Using an Optical-Resonator," *Applied Physics B-Photophysics and Laser Chemistry*, vol. 31, pp. 97-105, 1983.
N. Satyan, W. Liang, and A. Yariv, "Coherence Cloning Using Semiconductor Laser Optical Phase-Lock Loops," *IEEE Journal of Quantum Electronics*, vol. 45, pp. 755-761, Jul. 2009.
C. T. Santis, S. T. Steger, Y. Vilenchik, A. Vasilyev, and A. Yariv, "High-coherence semiconductor lasers based on integral high-Q resonators in hybrid Si/III-V platforms," *Proceedings of the National Academy of Sciences*, Feb. 10, 2014.
A. Tsekoun, R. Go, M. Pushkarsky, M. Razeghi, and C. K. N. Patel, "Improved performance of quantum cascade lasers through a scalable, manufacturable epitaxial-side-down mounting process," *Proceedings of the National Academy of Sciences of the United States of America*, vol. 103, pp. 4831-4835, Mar. 28, 2006.
T. J. W. Ronnie, "Advances in High-Power Laser Diode Packaging," in *Semiconductor Laser Diode Technology and Applications*, D. S. Patil, Ed., ed: InTech, 2012.
A. W. Fang, H. Park, O. Cohen, R. Jones, M. J. Paniccia, and J. E. Bowers, "Electrically pumped hybrid AlGaInAs-Silicon evanescent laser," *Optics Express*, vol. 14, pp. 9203-9210, 2006.
A. Yariv, "Dynamic analysis of the semiconductor laser as a current-controlled oscillator in the optical phased-lock loop: applications," *Optics Letters*, vol. 30, pp. 2191-2193, Sep. 1, 2005.
A. W. Fang, E. Lively, H. Kuo, D. Liang, and J. E. Bowers, "A distributed feedback Silicon evanescent laser," *Optics Express*, vol. 16, pp. 4413-4419, 2008.
N. Satyan, W. Liang, F. Aflatouni, A. Yariv, A. Kewitsch, G. Rakuljic, and H. Hashemi, "Phase-controlled apertures using heterodyne optical phase-locked loops," *IEEE Photonics Technology Letters*, vol. 20, pp. 897-899, May-Jun. 2008.
N. Satyan, J. Sendowski, A. Vasilyev, G. Rakuljic, and A. Yariv, "Phase noise reduction of a semiconductor laser in a composite optical phase-locked loop," *Optical Engineering*, vol. 49, Dec. 2010.
N. Satyan, A. Vasilyev, G. Rakuljic, V. Leyva, and A. Yariv, "Precise control of broadband frequency chirps using optoelectronic feedback," *Optics Express*, vol. 17, pp. 15991-15999, 2009.
W. H. Louisell, A. E. Siegman, and A. Yariv, "Quantum Fluctuations and Noise in Parametric Processes" *Physical Review*, vol. 124, pp. 1646-&, 1961.
A. Yariv, "Phase Conjugate Optics and Real-Time Holography," *Ieee Journal of Quantum Electronics*, vol. 14, pp. 650-660, 1978.
M. Nakamura, A. Yariv, H. W. Yen, S. Somekh, and H. L. Garvin, "Optically pumped GaAs surface laser with corrugation feedback," *Appl. Phys. Lett.*, vol. 22, pp. 515-516, 1973.
M. Nakamura, H. W. Yen, A. Yariv, E. Garmire, S. Somekh, and H. L.Garvin, "Laser oscillation in epitaxial GaAs waveguides with corrugation feedback," *Appl. Phys. Lett.*, vol. 23, No. 5, pp. 224-225, 1973.
E. Ip, A. P. T. Lau, D. J. F. Barros, and J.M. Kahn, "Coherent detection in optical fiber systems," *Optics Express*, vol. 16, No. 2, pp. 753-791, 2008.
K. Kikuchi, "Digital coherent optical communication systems: fundamentals and future prospects," *IEICE Electronics Express*, vol. 8, No. 20, pp. 1642-1662, 2011.
A. W. Fang, H. Park, O. Cohen, R. Jones, M. J. Paniccia, and J. E. Bowers, "Electrically pumped hybrid AlGaInAs-Silicon evanescent laser," *Optics Express*, vol. 14, No. 20, pp. 9203-9210, 2006.
G. Roelkens, D. V. Thourhout, R. Baets, R. Notzel, and M. Smit, "Laser emission and photodetection in an InP/InGaAsP layer integrated on and coupled to a Silicon-on-Insulator waveguide circuit," *Optics Express*, vol. 14, No. 18, pp. 8154-8159, 2006.
X. K. Sun, A. Zadok, M. J. Shearn, K. A. Diest, A. Ghaffari, H. A. Atwater, A. Scherer, and A. Yariv, "Electrically pumped hybrid evanescent Si/InGaAsP lasers," *Optics Lett.*, vol. 34, No. 9, pp. 1345-1347, 2009.
T. Asano, B. S. Song, and S. Noda, "Analysis of the experimental Q factors (similar to 1 million) of photonic crystal nanocavities," *Optics Express*, vol. 14, No. 5, pp. 1996-2002, 2006.
Y. Akahane, T. Asano, B. S. Song, and S. Noda, "High-Q photonic nanocavity in a two-dimensional photonic crystal," *Nature*, vol. 425, No. 6961, pp. 944-947, 2003.
E. Kuramochi, H. Taniyama, T. Tanabe, K. Kawasaki, Y. G. Roh, and M. Notomi, "Ultrahigh-Q one-dimensional photonic crystal nanocavities with modulated mode-gap barriers on SiO2 claddings and on air claddings," *Optics Express*, vol. 18, No. 15, pp. 15859-15869, 2010.
P. J. Winzer and R. J. Essiambre, "Advanced optical modulation formats," *Proc. IEEE*, vol. 94, pp. 952-985, 2006.
J. Rahn, S. Kumar, M. Mitchell, H. Sun, K. T. Wu, G. Goldfarb, M. Kato, D. Krause, R. Nagarajan, F. Kish, and D. Welch, "Super-Channels: DWDM Transmission Beyond 100 Gb/s," *IEEE Photonics Conference (IPC)*, pp. 854-855, 2012.
C. Spiegelberg, J. H. Geng, Y. D. Hu, Y. Kaneda, S. B. Jiang, and N. Peyghambarian, "Low-noise narrow-linewidth fiber laser at 1550 nm (Jun. 2003)," *Journal of Lightwave Technology*, vol. 22, pp. 57-62, Jan. 2004.
K. Kikuchi, "Origin of residual semiconductor laser linewidth in high-power limit," *Electronics Lett.*, vol. 24, pp. 1001-1002, 1988.
K. Kikuchi, "Effect of 1/f-type FM noise on semiconductor laser linewidth residual in high-power limit," *IEEE J. Quantum Electronics*, vol. 25, pp. 684-688, 1989.
K. Kikuchi, "Impact of 1/f-type FM noise on coherent optical communications," *Electronics Lett.*, vol. 23, pp. 885-887, 1987.
K. Kikuchi and T. Okoshi, "Dependence of semiconductor-laser linewidth on measurement time-evidence of predominance of 1/f noise," *Electronics Lett.*, vol. 21, pp. 1011-1012, 1985.
K. Kikuchi, T. Okoshi, M. Nagamatsu, and N. Henmi, "Degradation of bit-error rate in coherent optical communications due to spectral

(56) References Cited

OTHER PUBLICATIONS spread of the transmitter and the local oscillator," *J. Lightwave Technology*, vol. 2, pp. 1024-1033, 1984.
A.H. Henry, "Theory of the linewidth of semiconductor lasers," *IEEE J. Quantum Electronics*, vol. 18, pp. 259-264, 1982.
N. Satyan, W. Liang, A. Kewitsch, G. Rakuljic, and A. Yariv, "Coherent Power Combination of Semiconductor Lasers Using Optical Phase-Lock Loops," *IEEE Journal of Selected Topics in Quantum Electronics*, vol. 15, pp. 240-247, Mar.-Apr. 2009.
A. Yariv, "Internal Modulation in Multimode Laser Oscillators," *Journal of Applied Physics*, vol. 36, pp. 388-&, 1965.
A. Yariv, "The Beginning of Integrated Optoelectronic Circuits," *IEEE Transactions on Electron Devices*, vol. 31, pp. 1656-1661, 1984.
P. J. Winzer, "High-spectral-efficiency optical modulation formats," J.Lightwave Tech., vol. 30, No. 24, pp. 3824-3835, 2012.
K. Kikuchi, T. Okoshi, M. Nagamatsu, and N. Henmi, "Degradation of bit-error rate in coherent optical communications due to spectral spread of the transmitter and the local oscillator," J. Lightwave Technology, vol. 2, No. 6, pp. 1024-1033, 1984.
S. Ogita, Y. Kotaki, M.Matsuda, Y. Kuwahara, and H. Ishikawa, "Long cavity, multiple-phase-shift, distributed feedback laser for linewidth narrowing," Electronics Lett., vol. 25, No. 10, pp. 629-630, 1989.
H. Soda, Y. Kotaki, H. Sudo, H. Ishikawa, S. Yamakoshi, and H. Imai, "Stability in single longitudinal mode-operation in GaInAsP—InP phase adjusted DFB lasers," IEEE J. Quantum Electronics, vol. 23, No. 6, pp. 804-814, 1987.
S. Ogita, Y. Kotaki, H. Ishikawa, and H. Imai, "Optimum design for multiple-phase-shift distributed feedback laser," Electronics Lett., vol. 24, No. 12, pp. 731-732, 1988.
M. Okai, T. Tsuchiya, K. Uomi, N. Chinone, and T. Harada, "Corrugation-pitch-modulated MQW-DFB laser with narrow spectral linewidth (170 kHz)," IEEE Photonics Technology Lett., vol. 2, No. 8, pp. 529-530, 1990.
K. Y. Liou, N. K. Dutta, and C. A. Burrus, "Linewidth-narrowed distributed feedback injection lasers with long cavity length and detuned Bragg wavelength," Appl. Phys. Lett., vol. 50, No. 9, pp. 489-491, 1987.
S. Ogita, M. Yano, H. Ishikawa, and H. Imai, "Linewidth reduction in DFB laser by detuning effect," Electronics Lett., vol. 23, No. 8, pp. 393-394, 1987.
H. Ishii, K. Kasaya, and H. Oohashi, "Narrow spectral linewidth operation (< 160 kHz) in widely tunable distributed feedback laser array," Electronics Lett., vol. 46, No. 10, pp. 714-U74, 2010.
A. H. Henry, "Theory of the linewidth of semiconductor lasers," IEEE J. Quantum Electronics, vol. 18, No. 2, pp. 259-264, 1982.
A. S. Song, S. Noda, T. Asano, and Y. Akahane, "Ultra-high-Q photonic double-heterostructure nanocavity," Nature Materials, vol. 4, No. 3, pp. 207-210, 2005.
M. Notomi, "Manipulating light with strongly modulated photonic crystals," Reports on Progress in Phys., vol. 73, No. 9, p. 096501, 2010.
M. C. Wu, Y. H. Lo, and S. Wang, "Linewidth broadening due to longitudinal spatial hole burning in a long distributed feedback laser," Appl. Phys. Lett., vol. 52, No. 14, pp. 1119-1121, 1988.
R. Schatz, "Longitudinal spatial instability in symmetrical semiconductor lasers due to spatial hole burning," IEEE J. Quantum Electronics, vol. 28, No. 6, pp. 1443-1449, 1992.
W. V. Sorin, K. W. Chang, G. A. Conrad, and P. R. Hernday, "Frequency-domain analysis of an optical FM discriminator," J. Lightwave Tech., vol. 10, No. 6, pp. 787-793, 1992.

L. B. Mercer, "1/f frequency noise effects on self-heterodyne linewidth measurements," J. Lightwave Tech., vol. 9, No. 4, pp. 485-493, 1991.
K. Kikuchi, "Impact of 1/f-type FM noise on coherent optical communications," Electronics Lett., vol. 23, No. 17, pp. 885-887, 1987.
L. Hou, M. Haji, J. Akbar, and J. H. Marsh, "Narrow linewidth laterally coupled 1.55 µm AlGaInAs/InP distributed feedback lasers integrated with a curved tapered semiconductor optical amplifier," Optics Letters, vol. 37, No. 21, pp. 4525-4527, 2012.
U. Kruger and K. Petermann, "The semiconductor laser linewidth due to the presence of side modes," IEEE J. Quantum Electronics, vol. 24, No. 12, pp. 2355-2358, 1988.
E. Ip and J. M. Kahn, "Feedforward carrier recovery for coherent optical communications," J. Lightwave Tech., vol. 25, No. 9, pp. 2675-2692, 2007.
M. Seimetz, "Laser linewidth limitations for optical systems with high order modulation employing feed forward digital carrier phase estimation," Optical Fiber Comm. Conf., vol. 1-8, pp. 2470-2472, 2008.
International Search Report for International Application No. PCT/US2014/044855 filed on Jun. 30, 2014 in the name of California Institute of Technology dated Nov. 12, 2014.
Written Opinion for International Application No. PCT/US2014/044855 filed on Jun. 30, 2014 in the name of California Institute of Technology dated Nov. 12, 2014.
Notomi, M., et al., *Ultrahigh-Q Nanocavity with 1D Photonic Gap*, Optics Express, 2008, vol. 16(15): pp. 11095-11102.
Halioua, Y. et al., *Hybrid III-V semiconductor/silicon nanolaser*, Optics Express, 2011, vol. 19(10): pp. 9221-9231.
Ahn, B. et al., *One-dimensional parabolic-beam photonic crystal laser*, Optics Express, 2010, vol. 18(6), pp. 5654-5660.
Gong, Y. et al., *Nanobeam photonic crystal cavity quantum dot laser*, Optics Express, 2010, vol. 18(9), pp. 8781-8789.
Zhang, Y. et al. *Photonic crystal nanobeam lasers*, Applied Physics Letters, 2010, vol. 97, pp. 051104-1-051104-3.
Coldren, L. et al. "Tunable semiconductor lasers: a tutorial" Journal of Lightwave Technology, 2004, vol. 22, pp. 193-202—Abstract Only.
Jayaraman, V. et al. "Theory, design, and performance extended tuning range semiconductor lasers with sampled gratings" IEEE Journal of Quantum Electronics 1993, vol. 29, pp. 1824-1834—Abstract Only.
Ishii, H. et al. "Narrow spectral linewidth operation (<160 kHz) in widely tunable distributed feedback laser array" Electronics Lett. 2010, vol. 46, No. 10, pp. 714-U74.
EPO Communication pursuant to Rules 161(2) and 162 EPC for European Patent Application No. 14820551.1, dated Feb. 10, 2016. 1 page.
Coldren, A. et al. Diode Lasers and Photonic Integrated Circuits, $2^{nd}$ Edition, published by John Wiley & Sons, Inc. 2012. 723 pages.
International Preliminary Report on Patentability for International Application No. PCT/US2014/044855 filed Jun. 30, 2014 on behalf of California Institute of Technology, dated Jan. 14, 2016. 12 pages.
Supplementary European Search Report issue for EP Application No. 14820551 filed on Jun. 30, 2014 in the name of California Institute of Technology, dated Jan. 26, 2017. (7 pages).
Final Office Action issued for U.S. Appl. No. 15/017,560, filed Feb. 5, 2016 in the name of California Institute of Technology, dated Apr. 10, 2017. (20 pages).

\* cited by examiner

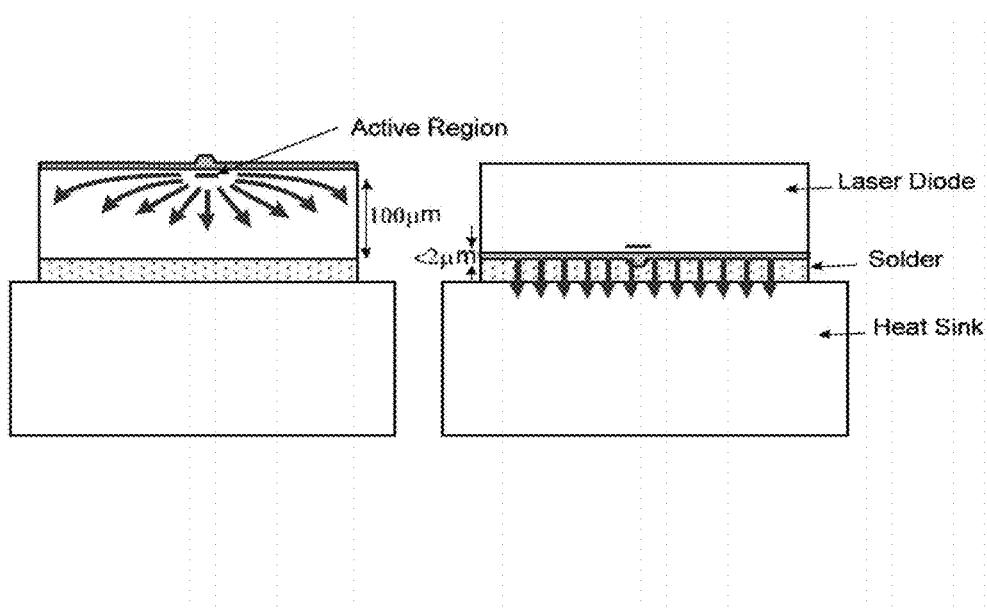
*Fig. 8A*        *Fig. 8B*

HIGH-COHERENCE SEMICONDUCTOR LIGHT SOURCES

CROSS REFERENCE TO RELATED APPLICATIONS

The present application claims priority to related Provisional U.S. Patent Application No. 61/842,770 filed 3 Jul. 2013 which is incorporated by reference in its entirety as if fully set forth herein.

STATEMENT OF GOVERNMENT GRANT

The present application relates to an invention that was made with support of the United States government under contract no. W911NF-10-1-0103 awarded by the U.S. Army Research Office and under contract no. HR0011-12-C-0006 awarded by the Defense Advanced Research Projects Agency (DARPA) of the U.S. Department of Defense. The U.S. government has certain rights in an invention related to the present application.

BACKGROUND

Technical Field

Embodiments of the present invention relate generally to light sources. More particularly, example embodiments of the present invention relates to high-coherence semiconductor light sources.

A distributed feedback (DFB) laser may be disposed within a semiconductor device such as a laser diode (LD). An active region of the DFB LD may comprise a diffraction grating to provide optical feedback for the laser over a narrow wavelength band, which may be selected according to the pitch with which the grating is fabricated. The narrow output spectrum characteristic of DFB lasers gave rise to their usefulness in optical communications, in which information is exchanged over networks of optical fiber and other transmission media. Conventional semiconductor distributed feedback lasers have been used as light sources for powering the fiber-optic based internet and related networks since the mid-1970s. Since then, volumes of network traffic have exploded, along with concomitant demand for higher bandwidth and increased data rates.

For example, the explosive growth of the internet over the last 20 years has created a geometrically increasing demand for bandwidth. Existing communication approaches typically meet this bandwidth demand by an optical fiber network with multiple channels. Using dense wavelength division multiplexing (DWDM) techniques, each of the multiple channels comprises an optical wavelength different from an optical wavelength of each of the other channels.

Information is transmitted over DWDM networks at 1 bit per pulse by modulating the intensity of the light source (e.g., on/off keying) at speeds up to 10 Gb/s. The upper data rate is typically limited by optical impairments, which are induced or introduced by the optical fiber transmission media. The full utilization of the available number of channels in the optical spectrum along with the bound on modulation rates has instigated the search for alternative information transmission schemes to meet the ever increasing bandwidth demand.

The growing demand for transmitting information at ever-higher data rates has led to the development of coherent communication, in which information is encoded on an optical wave using principally a modulation of its phase. Quantum-based limitations related to their inherent phase or temporal coherence characteristics limit the phase stability of conventional DFB lasers. The channel capacity of conventional DFB lasers is thus insufficient for handling the demands imposed by the migration of networks to coherent communication.

Improved coherence has thus been long sought in semiconductor DFB lasers. Previous approaches have used elongation of the laser cavities, multiple phase-shifts for the engineering of longitudinal modes therein, optimization of the active laser medium, e.g. strained QW (quantum well), and wavelength detuning.

The spectral linewidths achieved using such techniques in commercial and other conventional or state of the art lasers however remain persistently high. For example, spectral linewidths of conventional DFB lasers remains above 100 kHz, and this linewidth value itself reflects a narrowness that may be attained only using high pump currents. Moreover, linewidths at this level remain too high to satisfy the demands presented by multi-phase coherent communication and other useful applications.

Some fiber based lasers, which have linewidths below 1 kHz, and external cavity lasers (ECL), which have linewidths below 10 kHz, have high coherence characteristics. However, they typically have bulky and complex structures, which render them incompatible with the physical scaling demands of growing networks.

Contemporary optical communication networks are powered extensively by semiconductor lasers, including conventional DFB LDs, because of the benefits of their small size, high power output, high efficiency, low cost, and potential integration opportunities with associated electronic circuits. Due, however, to their significant phase noise characteristics, primarily of intrinsic quantum mechanical origin, conventional semiconductor lasers, including typical conventional DFB LDs, are typically incapable of meeting the stringent spectral purity requirements to ultra-high-speed communication networks.

A semiconductor distributed feedback laser capable of handling the requirements imposed by coherent communication networks, without using DWDM would thus be useful. A distributed feedback laser free of the quantum-based phase or temporal coherence characteristics inherent in conventional DFB lasers would also thus be useful. It would further be useful to improve significantly the phase or temporal coherence characteristics and the channel capacity of a distributed feedback laser relative to conventional DFB LDs.

Approaches described in this section may, but not necessarily, have been conceived or pursued previously. Unless otherwise indicated, it should not be assumed that any approaches discussed above include any alleged prior art merely by any such discussion. Not dissimilarly, any issues discussed in relation to any of these approaches should not be assumed to have been recognized in any alleged prior art merely based on any such discussion above.

SUMMARY

Example embodiments of the present invention relate to a resonator for a laser device. The laser resonator has at least one active material for amplifying light associated with an optical gain of the resonator. The laser resonator also has one or more passive materials disposed in proximity with the at least one active material wherein the resonator oscillates over one or more optical modes, each of the one or more optical modes corresponding to a particular spatial energy distribution and resonant frequency, and wherein, based on a characteristic of the one or more passive materials, for the particular spatial energy distribution corresponding to at least one of the one or more optical modes, a preponderant portion of optical energy is distributed apart from the active material.

The one or more passive materials may include a low loss material for storing optical energy of the preponderant portion distributed apart from the active material. The one or more passive materials may also include a buffer material disposed between the low loss material and the at least one active material for controlling a ratio of the optical energy stored in the low loss material to a portion of the optical energy in the active material. The buffer material may include a material like silicon dioxide, which has a low refractive index. The active material may include a III-V material and the low loss material may include silicon. The passive materials may be disposed in layers, at least one of which is bonded (e.g., with wafer bonding) with a layer with active material.

The low loss passive material may be configured with a pattern of holes. The configured hole pattern may determine an oscillation frequency, an output rate and an output mode profile of the resonator and deters spontaneous emission therefrom. The pattern of holes may have a one-dimensional (1D) configuration, such as a linear or near linear aspect. The configured pattern of holes may include an approximately uniform array of holes of approximately uniform size, and a defect (e.g., related to the approximate uniform size) disposed within (e.g., over, in or nearly in a center area of) the approximately uniform array of holes.

Example embodiments of the present invention also relate to laser devices with such resonators disposed on semiconductor dies. The laser devices may have a heat sink component attached to the semiconductor die and configured therewith for removing heat generated in the active material from the resonator of the laser device. The heat sink may be attached to the semiconductor die with an epitaxial-side-down configuration in relation to the active material of the laser resonator (or in other configurations). The laser device may also have a detector component attached to the semiconductor die and configured therewith for determining an output characteristic of the laser resonator. The output characteristic may relate to measuring a frequency noise related component of the resonator output, which may include computing a high frequency noise spectrum of the resonator output and suppressing measurement of low frequency fluctuations of the resonator output.

Lasing refers herein to generating coherent light over one or more infrared, visible, ultraviolet, etc. wavelengths by a laser (light amplification by stimulated emission of radiation) process. Example embodiments of the present invention relate to a method for lasing, which includes amplifying light associated with an optical gain in at least one active material of an optical resonator, and distributing spatial energy within the resonator, in which one or more passive materials are disposed in proximity with the at least one active material, in which the resonator oscillates over one or more optical modes, each of the one or more optical modes corresponding to a particular spatial energy distribution and resonant frequency, and in which, based on a characteristic of the one or more passive materials, for the particular spatial energy distribution corresponding to at least one of the one or more optical modes, a preponderant portion of optical energy is distributed apart from the active material.

The one or more passive materials may include a low loss material for storing optical energy of the preponderant portion distributed apart from the active material, as well as a buffer material, which is disposed between the low loss material and the at least one active material and effectively controls a ratio of the optical energy stored in the low loss material to a portion of the optical energy in the active material. Example embodiments relate to lasers, e.g., systems, devices products, etc. for sustaining such lasing processes, as well as to methods for fabricating them.

Example embodiments may thus implement a high-Q, separated function semiconductor laser (high-Q SFL), which is characterized by a phase coherence with an order of magnitude improvement over high quality conventional DFB lasers. For example, an embodiment of the present invention is implemented with a high-Q SFL having a spectral linewidth of 18 Kilohertz (kHz) at the commonly used optical communication wavelength of 1.55 micrometers ($\mu$m).

An example embodiment of the present invention is implemented using optical phase and/or quadrature amplitude modulation to encode information over a complex 2D phase plane. The use of optical phase/quadrature amplitude modulation (PQAM) may thus obviate DWDM.

The example implementation may use coherent detection (CD) at a receiver to recover the full field of an optical signal thus encoded at a transmitter, including the amplitude and phase of the signal. Coherent detection allows an embodiment of the present invention to correct or compensate for fiber-induced optical impairments, such as chromatic and polarization mode dispersion, using digital signal processing (DSP) techniques. The example implementation may thus exceed the capability of the typically-used direct detection approaches.

BRIEF DESCRIPTION OF THE DRAWINGS

Example embodiments of the present invention are described below in relation to a high-coherence semiconductor light source. The description below refers to the following drawings, which comprise a part of the specification of the present application. In the drawings:

FIG. 8A depicts a first example heat dissipation configuration, according to an embodiment of the present invention;

FIG. 8B depicts a second example heat dissipation configuration, according to an embodiment of the present invention;

Figure 7A:
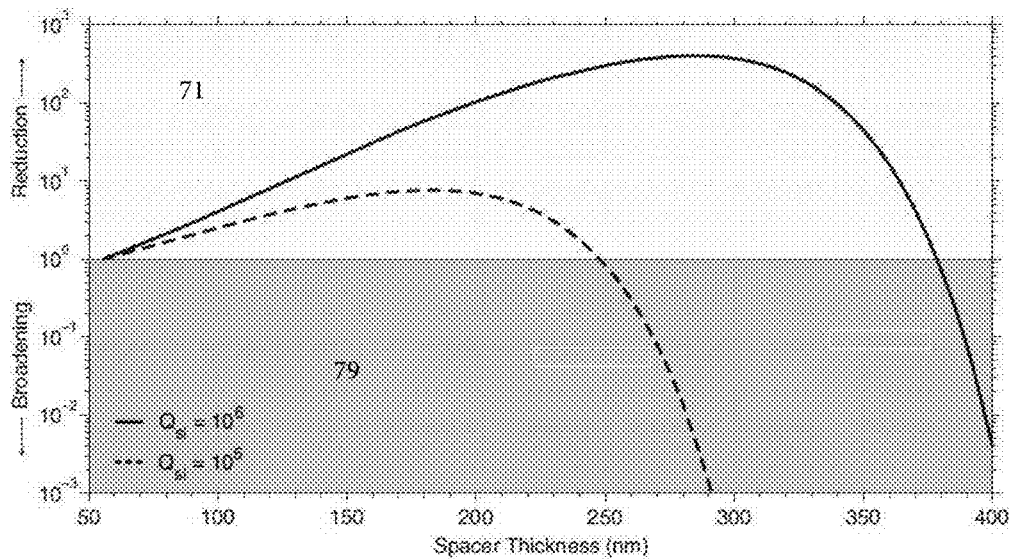
FIGS. 7A and 7B depict a representation of quantum noise effects on linewidth.

No scale applies in these drawings unless and except as specifically stated, as with reference to the vertical axis and the horizontal axis shown in Figure (FIG. 7A, etc.

DETAILED DESCRIPTION

Laser resonators are described herein in relation to example high-coherence semiconductor light sources. Example embodiments are described in relation to a high-Q separated function hybrid laser. In the following description, for the purposes of explanation, numerous specific details are set forth in order to provide a thorough understanding of the present invention. It will be apparent, however, that embodiments of the present invention may be practiced without these specific details. In other instances, well-known structures and devices are not described in exhaustive detail, in order to avoid unnecessarily obfuscating, obstructing, obscuring, or occluding aspects of embodiments of the present invention.

Overview

A laser resonator includes an active material, which amplifies light associated with an optical gain of the resonator, and passive materials disposed in proximity with the active material. The resonator oscillates over one or more optical modes, each of which corresponds to a particular spatial energy distribution and resonant frequency. Based on a characteristic of the passive materials, for the particular spatial energy distribution corresponding to at least one of the optical modes, a preponderant portion of optical energy is distributed apart from the active material. The passive materials may include a low loss material, which stores the preponderant optical energy portion distributed apart from the active material, and a buffer material disposed between the low loss material and the active material, which controls a ratio of the optical energy stored in the low loss material to a portion of the optical energy in the active material.

Optical Phase/Quadrature Amplitude Modulation

Figure 1:
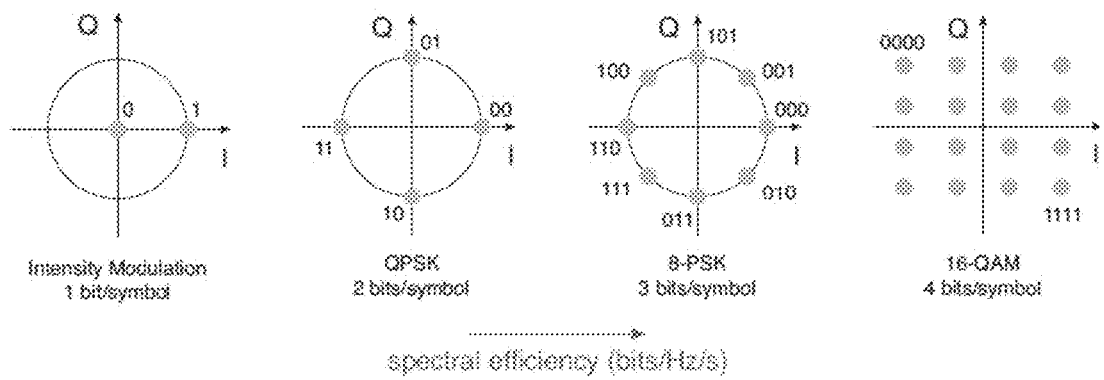
FIG. 1 depicts example constellation diagrams representing modulation schemes of various spectral efficiencies.

An example embodiment of the present invention is implemented using optical phase and/or quadrature amplitude modulation to encode information over a complex 2D phase plane. The use of optical phase/quadrature amplitude modulation (PQAM) may obviate (or be combined with) conventional DWDM approaches and allows the use of example embodiments in coherent communications and other applications. FIG. 1 depicts example constellation diagrams representing modulation schemes of various spectral efficiencies.

Encoding information in the phase of the optical carrier as opposed to only its amplitude, allows for increase in spectral efficiency (bits/Hz) and thus more efficient utilization of the available spectrum. For example, modulating an optical signal according to its intensity allows each amplitude value, e.g., 'on' or 'off', to represent only a single data bit e.g., '0' or '1', respectively.

Somewhat more spectral efficiency may be achieved using QPSK (quadrature phase shift keying) and 8-PSK modulation schema, which respectively allow each symbol disposed over the complex plane to represent two (2) symbols (e.g., 00, 01, 10, 11), and three (3) symbols (e.g., 000, 001, 010, 000, etc.). In a 16-QAM (quadrature amplitude modulation) scheme, four (4) bits can be transmitted per pulse, which represents a quadrupling of bandwidth at a given modulation (baud) rate over conventional intensity modulation.

Commercial communication links may now operate at data rates of 100 Gb/s per channel based on dual polarization, quadrature phase shift keying (DP-QPSK), and "next-generation" lines with rates of 400 Gb/s lines are now under development. Example embodiments of the present invention may be implemented using higher-level modulation formats (e.g. 16, 64, 256-QAM). Coupled with the use of DWDM techniques, an example embodiment may be used to provide Tb/s-scale network bandwidths.

Figure 2:
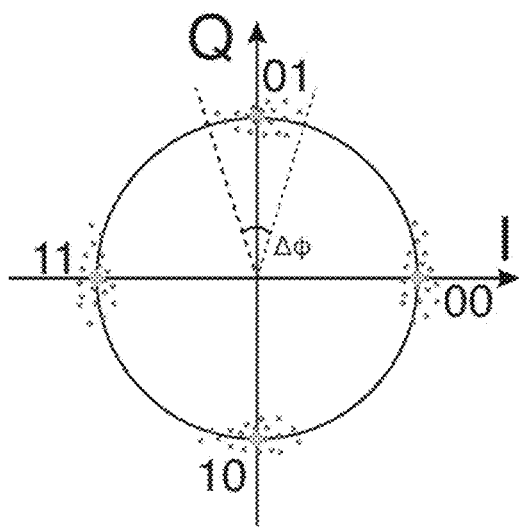
FIG. 2 depicts an example of noise effects in phase modulation, according to an embodiment of the present invention.

Raising the spectral purity of laser sources allows them to transmit information using the more efficient phase constellations of higher complexity. However, spontaneous emission and other such quantum noise effects may scatter, spread or smear phase based signal information. Such inherent phase noise characteristics causes a spread in the phase of the symbols transmitted therewith. FIG. 2 depicts an example of noise effects in phase modulation. As seen in FIG. 2, phase noise may degrade the certainty with which the phase of a carrier may be recovered at a receiver. Thus, broader phase noise spreads result in higher detection the ambiguity, which may be quantified as a bit error rate (BER).

Example embodiments of the present invention relate to semiconductor lasers implemented on hybrid Si/III-V platforms having an extremely narrow quantum linewidth, relative to conventional DFB LDs, of below 20 kHz and below 5 kHz and may thus be used in ultra-high speed optical communication networks and other applications that demand a high degree of coherence, such as interferometric sensing and laser ranging (LIDAR) over long distances.

Moreover, the hybrid platform thus implemented is compatible with the Si-based CMOS (complimentary metal oxide semiconductor) process, which enables on-chip integration with electronics and other optical passives and thus allows fabrication of complete, small factor devices such as the SFPx, (small factor pluggable) modules used in many telecom applications. The compactness and relatively simple structure of the lasers implemented by embodiments of the present invention provides high scalability and allows their deployment in large numbers on one semiconductor chip, which external cavity and fiber lasers cannot achieve.

Example Coherence Improvements

The hybrid platforms also enable generating narrow linewidths very close to threshold based on the quality factor of the resonator and thus have lower power consumption relative to conventional DFB LDs in which narrow linewidths are available typically by increasing pump currents. Notwithstanding high pump currents however, the coherence levels achievable with conventional (e.g., commercially available) DFB lasers are typically limited to linewidths $(\Delta v)_{ST}$ in excess of 100 kHz. This limitation of conventional DFB LDs appears to be due to high cavity losses and spontaneous emission, which may be the fundamental mechanism by which coherence is degraded.

Example embodiments of the present invention relate to a high-Q separated function hybrid laser, which is implemented with an ultra low loss resonator, deterrence of spontaneous emission and integration techniques, which relative to conventional approaches, improve coherence (e.g., linewidth) by over an order of magnitude, and are thus capable of use in coherent communications at Tb/s data rates, advanced sensing networks, and other useful applications.

Frequency noise is the time derivative of a laser's phase noise $\phi_n(t)$. Semiconductor lasers are characterized by a frequency noise spectrum that has two components, one component related to a lower frequency component and another component related to a higher frequency.

At low frequency offsets, e.g., below approximately 1 MHz (<~1 MHz), the frequency noise has a 1/f-type of spectrum. This 1/f-related noise comprises largely technical noise of origins not yet well explained. Due to the low-frequency nature of this technical noise component, it manifests itself as a relatively slow jitter in the oscillation frequency of the laser.

At higher frequency offsets (e.g., >1 MHz), the frequency noise is characterized by a white noise spectrum of quantum origin, as described below. This quantum white noise spectrum directly translates to a Lorentzian field lineshape.

Coherent communication and coherent sensing, LIDAR and related applications typically use measurements over short time scales (<1 µs). The duration of a symbol in high-speed communication network is ~1 ns. Interferometric delays and measurement times in sensing and LIDAR applications, etc. are <1 µs. These measurements are therefore primarily impacted by the (high-frequency) white noise spectrum of the semiconductor laser frequency noise.

Moreover, the low-frequency 1/f noise can be compensated externally using a feedback loop. For example, Pound-Drever-Hall locking to a stable cavity, or coherence cloning using an optical phase-locked loop may be used for external compensation over such low frequency noise. Example embodiments of the present invention relate to addressing the quantum white noise spectrum, and its associated Lorentzian linewidth, which comprise a more fundamental and critical issue.

Figure 3:
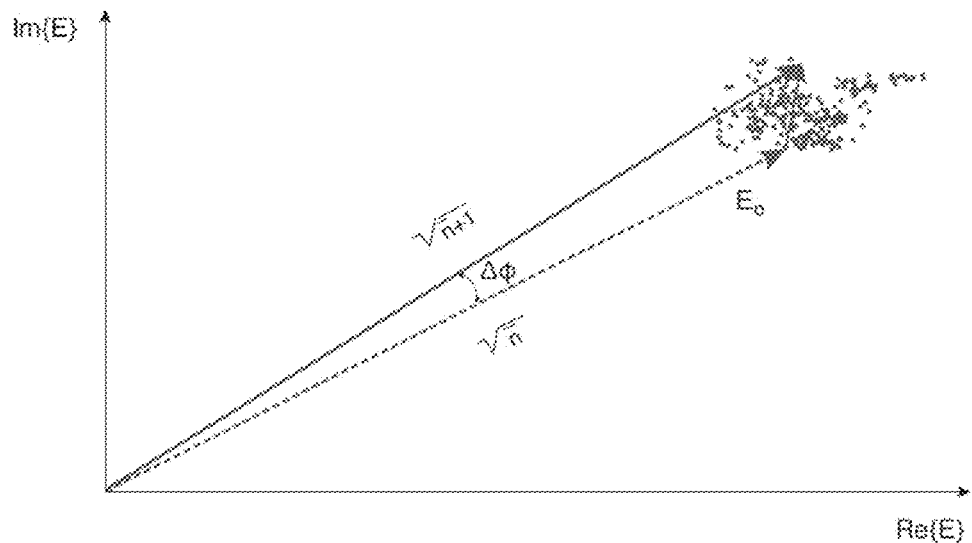
FIG. 3 depicts a phasor representation of an example spontaneous emission event, according to an embodiment of the present invention.

A fundamental source of phase noise in a semiconductor laser is quantum mechanical in origin. The phase noise results from spontaneously emitted photons in the active region of the laser. With every spontaneous emission event, a photon of random phase is added to the laser field. Under the effect of a large number of spontaneous emission events, the complex field of the laser may undergo random walking (e.g., phase diffusion) in the phase plane. FIG. 3 depicts a phasor representation of an example spontaneous emission event, according to an embodiment of the present invention.

For a semiconductor laser, the phase excursion accumulated over a measurement time interval $\tau$ can be most fundamentally expressed according to Equation 1, below.

$$\langle |\Delta \phi(\tau)|^2 \rangle = \frac{N_{th} R_{sp}}{(2\bar{n})(1+\alpha^2)\tau} \quad (1)$$

In Equation 1, $R_{sp}$ represents the spontaneous emission rate into the lasing mode, $N_{th}$ the carrier density at threshold, $\bar{n}$ the average number of coherent photons in the same mode, and $\alpha$ the amplitude-phase coupling coefficient (also known as "Henry factor"). The frequency noise associated with this type of quantum phase noise has uniform, or white, spectral distribution. This white noise spectrum results in a Lorentzian field lineshape, with a Schawlow-Townes spectral linewidth, as shown in Equation 2, below.

$$(\Delta v)_{ST} = \frac{N_{th} R_{sp}}{(4\pi \bar{n})(1+\alpha^2)} \quad (2)$$

The phasor diagram shown in FIG. 3 represents the effect of one spontaneous emission event on the complex electric field of the laser. The constellation of "dots" depicted in FIG. 3 traces an example random walk of the field in the complex plane resulting from a large number of independent spontaneous emission events.

Example embodiments of the present invention relate to a semiconductor laser with significant linewidth reduction over conventional DFB LDs. Lasers are implemented using hybrid Si/III-V integration, a high-Q laser cavity design, spontaneous emission control, and efficient heat management in the hybrid Si/III-V platforms.

To implement these hybrid high-Q lasers with control over spontaneous emission and effective heat management, example embodiments of the present invention relate to:

(1) a robust measurement technique to accurately determine the frequency noise spectrum of semiconductor laser, particularly at very low noise levels; and (2) a high-Q separated function Si/III-V laser with high-coherence characteristics.

A semiconductor laser prototype is thus implemented with improved linewidths, output power of at least 100 µW and side mode suppression ratio (SMSR) of at least 40 dB.

Moreover, a fabrication process is thus implemented that may enable further linewidth reduction, e.g., to <5 kHz, as well as wafer-level scaling. While not an unrelated legacy processes for fabricating of hybrid, Si/III-V lasers may also be scalable (e.g., to full 2-inch wafers), improved process cost-effectiveness, and throughput may thus be provided in relation thereto. Example embodiments of the present invention use spontaneous emission control and thermal management, and develop scalable high-yield fabrication processes and robust measurement techniques as described herein.

Example Hybrid Silicon/III-V Integration

Heterogeneous integration of III-V semiconductors with silicon allows the incorporation of light emission and other active functionalities on a silicon platform. In contrast to legacy integration techniques however, example embodiments of the present invention replace a portion of highly absorbing template III-V material with Si (e.g., using wafer bonding), which achieves a very low loss optical platform. Template III-V semiconductors used for conventional laser diodes are about three orders of magnitude more absorbing than the intrinsic Si used as described and claimed herein. The higher absorbance of III-V semiconductors is due primarily to heavy doping in contact and cladding regions.

Figure 4:
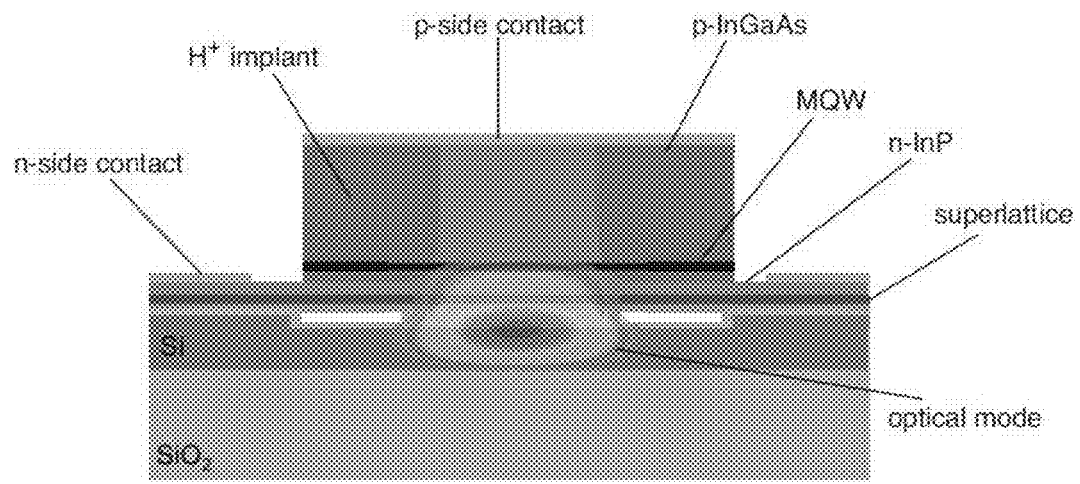
FIG. 4 depicts a schematic cross-section of a first example hybrid Si/III-V Laser, according to an embodiment of the present invention.

FIG. 4 depicts a schematic cross-section of a first example hybrid Si/III-V Laser, according to an embodiment of the present invention. In the hybrid Si/III-V platform thus implemented, the lasing mode is configured to reside mostly in the low absorbance Si region. The hybrid Si/III-V platform thus allows for the separation and independent optimization of two significant functions of laser operation, (1) photon generation, and (2) photon storage. In example embodiments, efficient carrier injection and photon generation is conducted through the III-V semiconductor portion of the hybrid, while the vast majority of the coherent photons are stored in the low loss silicon portion of the hybrid.

Photon storage may be quantified by a photon cavity lifetime $\tau_{pk}$ or, equivalently, the cavity quality factor $Q=\omega_o\tau_{pk}$. Reducing the losses in the laser cavity has a two-fold effect on the laser's quantum noise linewidth. First, the cavity loss reduction increases the average number of coherent photons $\bar{n}$ stored in the cavity at a given injection level. Second, the cavity loss reduces the carrier density $N_{th}$ at threshold, which reduces the concentration of carriers contributing to spontaneous emission. Given the relationship of $\bar{n}$, and $N_{th}$ and cavity loss, or equivalently on the cavity Q, the laser linewidth may be scaled according to Equation 3, below.

$$(\Delta v)_{ST} \sim \frac{1}{Q^2} \quad (3)$$

An example embodiment is operable for reducing the linewidth by maximizing the cavity quality factor Q.

The total cavity quality factor Q of a hybrid Si/III-V laser can be expressed according to Equation 4, below.

$$\frac{1}{Q} = \frac{\Gamma}{Q_{III-V}} + \frac{1-\Gamma}{Q_{Si}} \quad (4)$$

In Equation 4, $Q_{III-V}$, $Q_{Si}$ represent quality factors associated with the optical losses in the III-V region, and in the Si region of the hybrid cavity, respectively. Further, $\Gamma$ represents the mode confinement factor in the III-V region. Losses in the III-V region are high; dominated by absorption. Example embodiments of the present invention increase the total cavity quality factor Q by implementing device structures in which only a very small fraction of the mode resides in the lossy III-V region.

Example High-Q Cavity Design

The hybrid integration thus implemented improves cavity Q significantly and reduces linewidth substantially, which improves coherence. As seen with reference to Equation 4, as more of the light is confined in Si portion of the hybrid structure, losses in Si become increasingly significant. For values of $\Gamma\ll 1$, the value of $Q_{Si}$ increases in significance in relation to maximum achievable total Q. In the silicon portion of the hybrid resonator, the main sources of loss include scattering, radiation, and absorption. Thus, $Q_{Si}$ may be expressed according to Equation 5, below.

$$\frac{1}{Q_{Si}} = \frac{1}{Q_{sc}} + \frac{1}{Q_{rad}} + \frac{1}{Q_{abs}}, \quad (5)$$

The absorption limited Q for Si-only resonators at telecom wavelength bands around 1.55 µm is typically $Q_{abs}>10^7$.

Example Photonic Resonator

Figure 5:
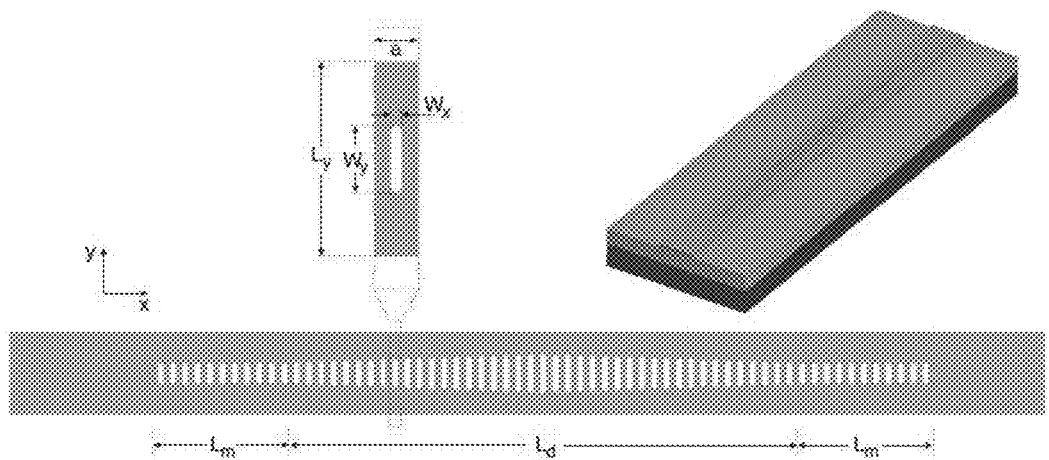
FIG. 5 depicts a top view of an example high-Q photonic resonator, according to an embodiment of the present invention.

An example embodiment relates to a 1D (one-dimensional) photonic crystal resonator, which is operable for minimizing radiation leakage, setting the lasing frequency, and ensuring single mode output generation. FIG. 5 depicts a top view (not to any scale) of an example high-Q photonic resonator, according to an embodiment of the present invention.

The example resonator may be implemented to comprise two (2) uniform mirror sections of a length $L_m$ and a bandgap modulated middle section with a length $L_d$, which is operable for localizing a high-Q defect resonance. The insets depict structural characteristics of a unit cell and a 3D perspective view of the resonator.

The example photonic resonator thus implemented may attain a $Q_{rad}>10^8$, thus eliminating radiation leakage as a critical or significant loss-contributing mechanism. Further, optimizing Si processes according to an example embodiment reduce scattering due to surface roughness to $Q>10^6$. As the value for $Q_{Si}=10^6$ may be significant in relation to the Si resonator, example embodiments may reduce linewidth by a factor of 100-1000 (in the limit of $\Gamma\to 0$), in relation to typical all-III-V InP-based semiconductor lasers for which $Q_{III-V}\sim 10^4$. As $\Gamma\to 0$ however, consequent reductions in modal gain may cause significant increase in threshold carrier density, which implies that an optimal value of $\Gamma$ for high coherence may exist. Hybrid lasers are also implemented with varying $\Gamma$ for determining an optimally narrow linewidth.

IC-Based Control Over Spontaneous Emission

Figure 6:
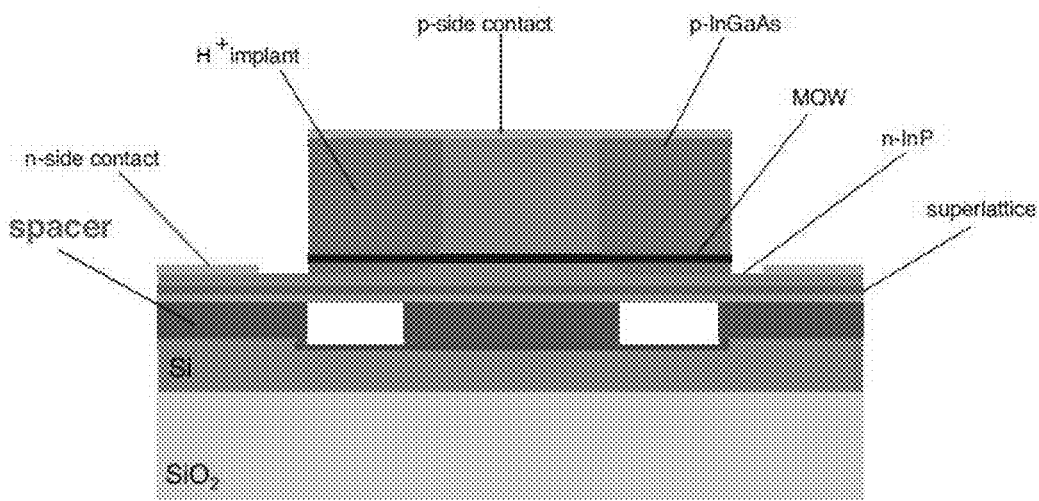
FIG. 6 depicts a schematic cross-section of a second example hybrid Si/III-V Laser, according to an embodiment of the present invention, according to an embodiment of the present invention.

In an example embodiment, the mode confinement factor ⌈ is tuned with the incorporation of a low refractive index spacer layer. FIG. 6A depicts a schematic cross-section of a second example hybrid Si/III-V Laser, according to an embodiment of the present invention. An example embodiment may be implemented in which the low refractive index spacer comprises a layer of silicon dioxide ($SiO_2$), which is disposed between the Si hybrid portion and the Group III-V hybrid portion. Varying the thickness of the spacer changes the penetration of the evanescent tail of the mode into the III-V portion of the hybrid, which controls the value of ⌈ and thus, the cavity quality factor Q as shown with reference to Equation 4, above. Further, this tuning affects linewidth as well.

Manipulating the penetration of the evanescent tail in the III-V hybrid portion changes the local intensity of the field in the active multiple quantum well (MQW) region, which affects the rate of spontaneous emission into the lasing mode according to Fermi's Golden Rule. Upon analyzing the spontaneous emission rate $R_{sp}$ into its constituent parameters, the quantum noise linewidth may be expressed according to Proportionality 6, below.

$$(\Delta v)_{ST} \propto \frac{\Gamma_{MQW} N_{th}^2(\Gamma_{MQW}, Q)}{Q} \quad (6)$$

In Proportionality 6, $\Gamma_{MQW}$ represents the mode confinement factor in the MQW region. The presence of $\Gamma_{MQW}$ in Proportionality 6 accounts for the modification of the spontaneous emission rate into the lasing mode, due to the change of the mode's intensity in the MQW region. The threshold carrier density, represented with $N_{th}$, scales in opposite directions with $\Gamma_{MQW}$ and Q. An optimum value of $\Gamma_{MQW}$ minimizes $(\Delta v)_{ST}$.

Figure 7B:
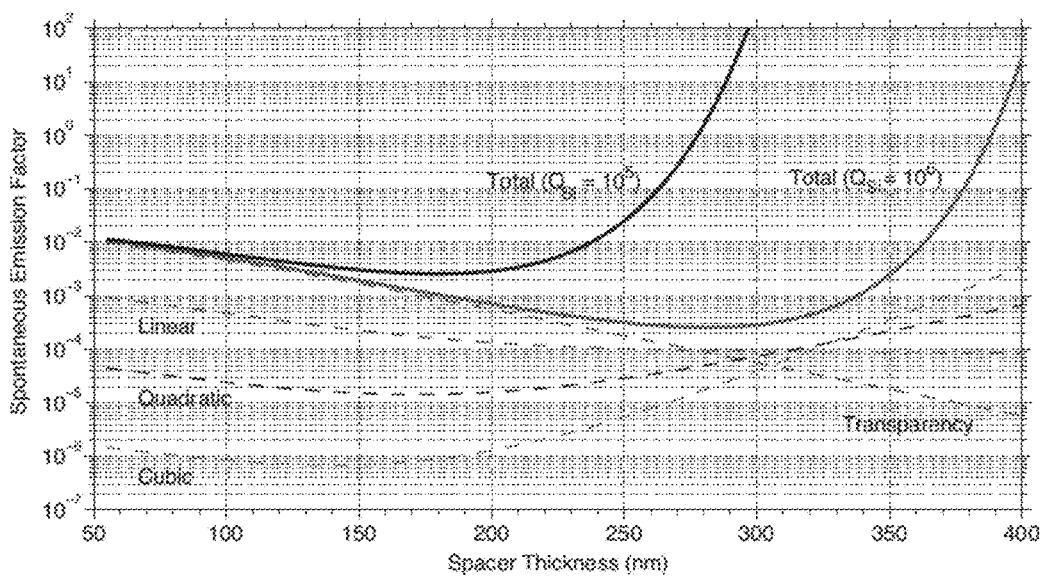

Based on Proportionality 6 and for typical parameter values for InP-based laser diodes, the linewidth reduction (or broadening) factor may be computed as a function of spacer thickness. FIG. 7A and FIG. 7B depict representations of quantum noise effects on linewidth for two different values of $Q_{Si}$.

In FIG. 7A, computed quantum noise linewidth reduction (or broadening) factor are plotted as a function of the low refractive index $SiO_2$ spacer thickness. The linewidth reduction factor comprises a ratio of the linewidth at a given spacer thickness to the linewidth for a nominal minimum thickness of 50 nm. The areas 71 and 79 correspond to linewidth reduction and broadening, respectively. The solid and dashed lines correspond to hybrid cavities with $Q_{Si}=10^6$ and $Q_{Si}=10^5$, respectively. FIG. 7B depicts a plot of the spontaneous emission factor as a function of the thickness of the $SiO_2$ spacer for two values of $Q_{Si}$, $10^5$ and $10^6$.

The roll-off and eventual linewidth re-broadening for thicker spacer thicknesses is due to the rise in $N_{th}$ as a result of insufficient gain from the MQW region at extremely low $\Gamma_{MQW}$ values. A linewidth reduction factor on the order of 100× is computed for values of $Q_{Si}=10^6$. The computed linewidth reduction is significantly downgraded for $Q_{Si}=10^5$, which illustrates the significance of the high-Q Si resonator. An example embodiment is implemented in which such linewidth reduction is achieved with fabrication and measurement of high-Q hybrid Si/III-V lasers with spacer thickness that vary between, e.g., 50-200 nm, inclusive.

Example Heat Dissipation in the Hybrid Si/III-V Laser Platform

External active cooling is used for precision control over laser operating temperature to allow its stable and narrow-linewidth operation. Temperature fluctuations cause the lasing frequency to jitter, which contributes to frequency noise at low frequency offsets. In addition to the ambient temperature, internal heating due to series resistances contributes to elevation of junction temperature. Without effective heat dissipation, steep temperature gradients may arise between the sink and the junction, which may negate the affect of the active cooling. Elevated junction temperatures then reduce gain significantly and enhance degenerative effects from non-radiative carrier recombination and current leakage, which can increase threshold current density and reduce slope efficiency and/or output optical power.

Heat dissipation for laser diodes is typically implemented by bonding the laser die to a thermoelectrically controlled (e.g., Peltier) heat sink. FIG. 8A and FIG. 8B each show typical heat dissipation configurations for a laser diode. FIG. 8A depicts a first example heat dissipation configuration, in which the laser is bonded to the heat sink with its epitaxial (epi) side configured in an "up" configuration. FIG. 8B depicts a first example heat dissipation configuration, in which the laser is bonded to the heat sink with its epi-side configured in a "down" configuration (opposite to the up configuration).

While epi-side up is a simpler configuration, its longer path (~100 μm) has a concomitantly higher thermal resistance from the heat source to the sink, relative to epi-side down. Yet while epi-side down has a more efficient heat-dissipating path (~2 μm), relative to epi-side down, it has a more complex and precise process. Nonetheless, epi-side down die bonding is somewhat more typical for managing heating in high power and quantum cascade lasers and other heat-intensive lasers.

An example embodiment is implemented with epi-side down heat management applied over the hybrid Si/III-V platform lasers. While also useful in some implementations, the epi-side up bonding scheme drives heat flow towards the sink through the silicon handle of its SOI (silicon-on-insulator) wafer. This sink-toward flow situation may be exacerbated first by the presence of a buried oxide layer (BOX), which has a thermal conductivity 100× lower than that of silicon. Further, the sink-toward flow may be promoted by the presence of air trenches on either side of an etched silicon ridge waveguide component. Unique to the hybrid Si/III-V laser platform, this flow raises the overall thermal resistance of epi-side up bonding schemes.

The hybrid Si/III-V lasers described herein may develop junction temperatures significantly higher than conventional III-V LDs, e.g., as seen with "early" thermal roll-offs observed in the L-I characteristics of hybrid Si/III-V lasers. To promote linewidth reduction, an example embodiment is implemented in which epi-side down bonding techniques are used, which is especially significant with modal gain limitations, which may arise with use of higher thickness spacers. For example, embodiment fabricates hybrid Si/III-V lasers using epi-side-down bonding, such as a flip-chip mounting. Nonetheless, the hybrid Si/III-V lasers described herein remain compatible with other hybrid integration processes as well.

Example Process Flow

Figure 9:
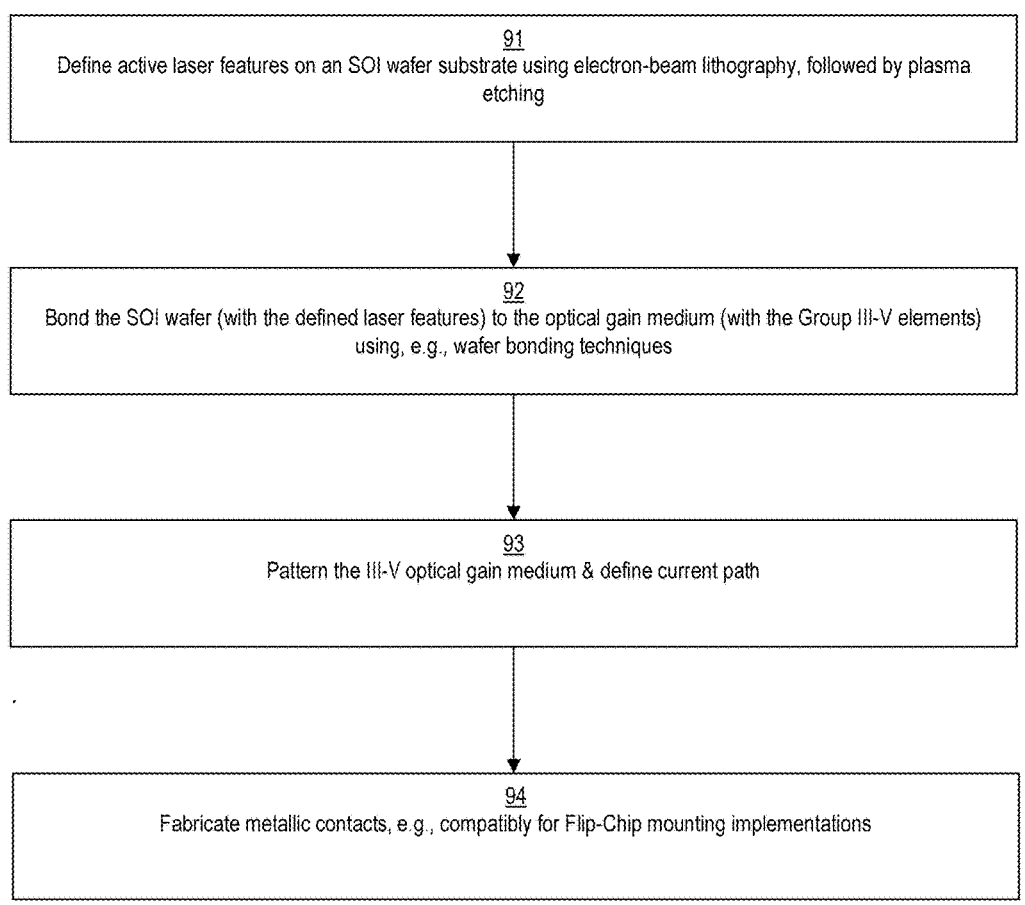
FIG. 9 depicts a flowchart for an example fabrication process, according to an embodiment of the present invention.

An example embodiment of the present invention relates to fabrication of a hybrid Si/III-V laser. FIG. 9 depicts a flowchart for an example fabrication process 90, according to an embodiment of the present invention. In step 91, electron-beam lithography, followed by plasma etching, defines active laser features on an SOI wafer substrate. In step 92, the SOI wafer with the defined laser features is bonded (e.g., wafer bonding) to the gain medium comprising the Template III-V elements. In step 93, the III-V medium is patterned and a current path is defined. In step 94, metallic contacts are fabricated so that the laser device is compatible with flip chip mounting.

An example embodiment may be implemented in which the passive Si resonator components are patterned with e-beam lithography (e.g., Vistec EBPG 5000+ lithography, Zeon ZEP 520A nano-photolithographic resist, etc.) and a transfer of resulting patterns to silicon with a pseudo-Bosch process (e.g., Oxford 380). The waveguide sidewalls are smoothened to improve $Q_{sc}$ by growing approximately 15 nm of dry thermal oxide (e.g., in which oxidation times are computed using a Massoud-related oxidization model). The oxide is then stripped with HF (hydrofluoric acid; e.g., Transene-Buffer HF-Improved) and approximately 20 nm of dry oxide is then re-grown. The silicon chip is then prepared for direct wafer bonding using acetone and isopropanol (IPA) based cleaning, followed by an organic strip in a stabilized mixture of sulfuric acid ($H_2SO_4$, aka HOSOOOH and hydrogen peroxide ($H_2O_2$ aka HOOH) such as Nanostrip (e.g., Cyantek) or the like for a 1 min duration or so.

An unpatterned III-V chip with an epi-structure is prepared through acetone and IPA cleans followed by aqueous ammonium hydroxide ($NH_4OH:H_2O$) in a corresponding 1:15 solution for 10 minutes or so. The chip surfaces on each opposite side are activated for bonding with five (5) or so treatments in oxygen plasma at 200 W (Suss NP12). The chips are then directly bonded. For example, the chips may be bonded with a mutual compression together, e.g., with forces approximating bringing them into contact and applying light pressure with tweezers, although the precise bonding mechanism remains unclear as to spontaneous bonding, or pressure-induced bonding, respectively. The bonded chips are then annealed at 150° C. for 1 h, followed by 285° C. for 5 h. After the bonding and/or annealing, the InP (Indium Phosphide) handle is removed in aqueous hydrochloric acid at e.g., a 1:3 $HCl:H_2O$ concentration.

An example embodiment may be implemented using ion implantation (e.g., H+, 170 keV, $5 \times 10^{-4}$ $cm^{-2}$) and an AZ5214E mask to define a current path above the silicon waveguide. A p-contact to p+-InGaAs (high-p-type Indium Gallium Arsenide) is formed over the current path by depositing layers of titanium, platinum and gold (Ti/Pt/Au, 20 nm/50 nm/150 nm) and lifting off image-reversed AZ5210 resist. A mesa is created in the III-V material by wet-etching down to the n-contact layer (e.g., using Piranha $_2SO_4:H_2O_2:H_2O$, 1:1:10, respectively for 7 s and $HCl:H_2O$, 1:2, respectively, for 17 s, Piranha 45 s). An n-contact to n+ InP (high-n-type Indium Phosphide) by depositing Germanium/Gold/Nickel/Gold (Ge/Au/Ni/Au, 30 nm/50 nm/12 nm/225 nm).

The die is thinned to 150 μm and cleaved into bars. Individual bars are annealed at 325° C. for 30 s. An aluminum oxide ($Al_2O_3$) anti-reflection coating of 250 nm is disposed over each of the opposing, substantially parallel facets of the bars.

Example embodiments may be implemented that measure frequency noise using Mach-Zehnder interferometry (MZI) for frequency discrimination. The differential delay is kept shorter than the expected laser coherence time. The corresponding MZI free-spectral range (FSR) comprises 847 MHz. The MZI interferometer converts laser phase fluctuations to intensity fluctuations when biased at quadrature and measured with a high speed photodetector, the spectrum of which is obtained on an RF spectrum analyzer. The choice for the interferometer delay may comprise a trade-off between the frequency scan range and the frequency gain.

Accurate results may be obtained in which the interferometer remains at quadrature for the duration of a high-resolution measurement of the frequency spectrum. Hybrid lasers thus under test (e.g., not being packaged), may be particularly sensitive to environmental or ambient temperature fluctuations, causing the laser center frequency to drift out of quadrature. The MZI may thus be locked in quadrature with negative electronic feedback to the pump current of the laser. This feedback loop bandwidth is kept below 100 Hz, which suffices for suppressing low-frequency temperature-induced fluctuations, while leaving the higher-frequency noise spectrum unaffected.

Example High-Q Separated Function Hybrid Si/III-V Laser

Figure 10:
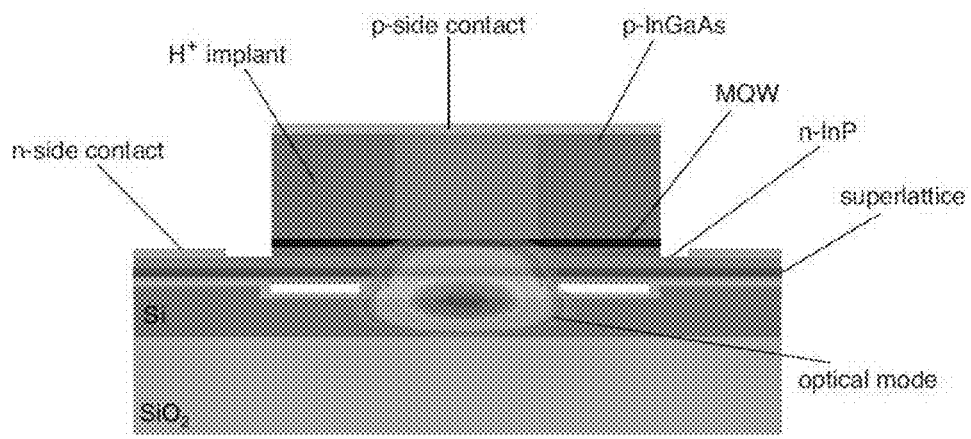
FIG. 10 depicts a cross-section of an example High-Q SFL device, according to an embodiment of the present invention.
Figure 11A:
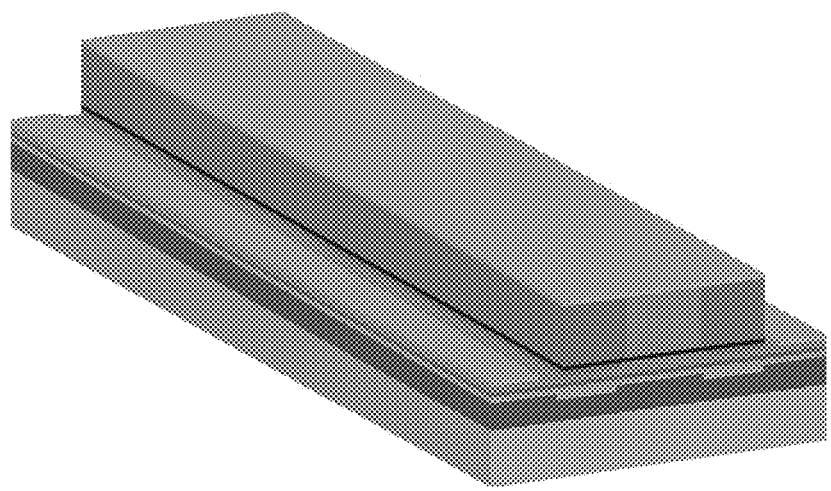
FIG. 11A depicts a perspective of the example High-Q SFL device, according to an embodiment of the present invention.

FIG. 10 depicts a cross-section of an example High-Q separated function hybrid laser (SFL) device 1000, according to an embodiment of the present invention. Laser 1000 represents the hybrid laser diode depicted in either or both of FIG. 4 or FIG. 6. FIG. 11A depicts a perspective of the example High-Q SFL laser 1000, according to an embodiment of the present invention. FIG. 11A depicts an example grating component of the High-Q SFL device 1000, according to an embodiment of the present invention.

Example embodiments of the present invention maximize the phase coherence of a semiconductor lasers with a spatial separation of two (2) of its major functions: the generation of photons, and the storage of photons. Existing DFB LDs, which may be constructed using III-V material components according to conventional approaches, inevitably compromise between such functions and in large part, it is this compromise that constrains or degrades the phase coherence performance in conventional LDs.

Example embodiments of the present invention relate to a two-material hybrid Si/III-V platform, which circumvents or obviates compromising between photon generation and photon storage and improves their phase coherence significantly over conventional LDs. In example embodiments, photons are generated largely in a component comprising a III-V optically active material, and photons are stored in a low-optical loss Si component. The III-V material is thus put to its most efficient and suitable use—photon generation—free from the conventional constraints of accommodating waveguiding and the photon storage functions. The storage and waveguiding are more efficiently in the low-loss Si material component.

As shown in FIG. 10, photon storage occurs in the low-loss Silicon component and the high-Q hybrid Si/III-V resonator as part of the laser cavity. The high-Q resonator stores a large amount of optical energy for a given power output and thus acts as an optical flywheel, which reduces the effects of phase perturbations caused by quantum mandated spontaneously-emitted photons generated in the III-V material.

Moreover, increasing the cavity Q reduces the total population of excited electrons and holes required to reach the oscillation threshold, which translates directly and proportionally to a decreased rate of loss-causing spontaneous emission events. Example embodiments may be implemented using Si substrates compatible with available wafer-scale processing techniques for fabrication of optoelectronic circuitry, devices and packages.

The effects of the factors limiting the laser coherence are evident in an expression for the phase excursion according to Equation 7, below.

$$\langle[\Delta\theta(\tau)]^2\rangle = \frac{R}{2\bar{n}}(1+\alpha^2)\tau, \qquad (7)$$

In Equation 7, R represents the spontaneous emission rate ($s^{-1}$) into the lasing mode, $\bar{n}$ represents the average number of coherent photons in the optical resonator, α represents the linewidth enhancement factor due to coupling of amplitude and phase fluctuations, and τ represents the symbol duration (s).

Reducing the overall optical losses in the laser resonator makes the value of R smaller, while for a given power emission, increases the value of $\bar{n}$. This double benefit of lowering the losses is highlighted by recasting Equation 7 in the form shown according to Equation 8, below.

$$\langle[\Delta\theta(\tau)]^2\rangle = \frac{4\pi^2 h \nu_o^3 \eta}{Q^2 P}(1+\alpha^2)\tau, \qquad (8)$$

In Equation 8, $\nu_0$ represents the lasing center frequency, η represents the population inversion factor, which characterizes the increase in the spontaneous emission rate due to partial inversion, P represents the total optical power emitted into the lasing mode, and Q represents the cold cavity, loaded quality factor of the laser resonator.

Enhancing the quality factor Q of the resonator leads to a major (e.g., proportional to $Q^2$) linewidth reduction. To maximize Q, it is helpful to separate it, conceptually, into the different optical loss mechanisms of which it is comprised, according to Equation 9, below [18].

$$\frac{1}{Q} = \frac{1}{Q_{rad}} + \frac{1}{Q_{ba}} + \frac{1}{Q_{sc}} + \frac{1}{Q_e}, \qquad (9)$$

In Equation 9 the subscripts of the loss components indicate radiation, bulk absorption, scattering, and external loss through the cavity's mirrors, respectively. The loss factors $Q_{rad}$, $Q_{ba}$, and $Q_{sc}$ represent sources of a loss $Q_i$ intrinsic to the resonator, which sets an upper bound on the maximum possible Q of the resonator. The resonator loading, $Q_e$, determines the fraction of stored energy that is tapped as useful output through the laser mirrors. There is a trade-off in laser design between stored energy and useful output.

Figure 11B:
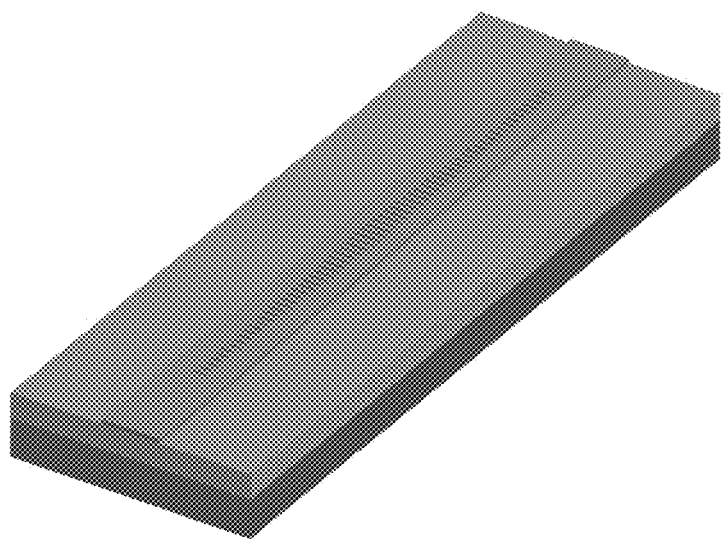
FIGS. 11B and 11C depict an example grating component of the High-Q SFL device, according to an embodiment of the present invention.
Figure 11C:
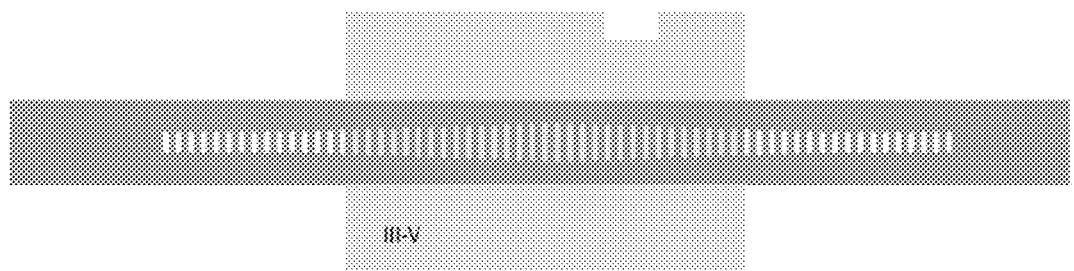

The high-Q hybrid resonator comprises a silicon waveguide, which is patterned with a 1D grating, as depicted in FIGS. 11B and/or 12A. The Si waveguide determines the oscillation frequency and tailors the longitudinal mode profile of the Laser. The coupling to radiation modes ($Q_{rad}^{-1}$) is minimized via a bandgap-modulated "defect" (e.g., nonuniform) section, disposed in the middle (or nearly so) of an otherwise uniform grating, as depicted in FIG. 12A.

Figure 12A:
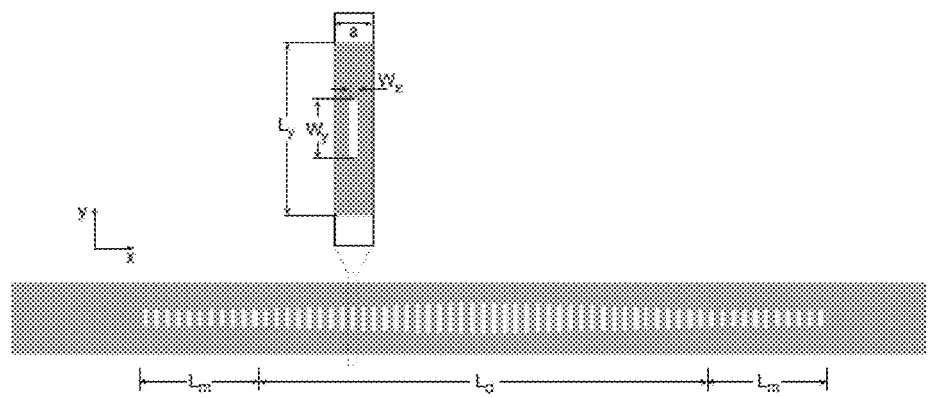
FIG. 12A depicts a top view of the geometry of the example grating component, according to an embodiment of the present invention.
Figure 12B:
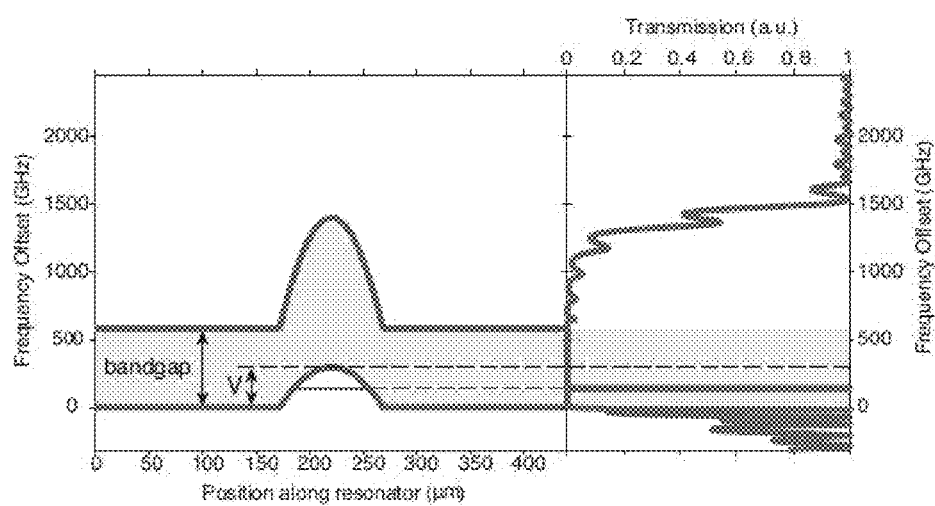
FIG. 12B depicts a spatial band structure of an example High-Q hybrid resonator plotted against a transmission spectrum simulated in relation thereto, according to an embodiment of the present invention.

The defect is designed directly in the frequency domain, e.g., by parabolically modulating the lower frequency band edge of the grating as a function of position along the resonator, as depicted in FIG. 12B. This quadratic modulation acts as a potential well, localizing a resonant mode with a Gaussian-like profile in both real and reciprocal space (FIG. 12D, 12E, respectively), not dissimilar to the ground state electron wavefunction in a quantum harmonic oscillator. Selecting a well depth V, comprising an offset frequency from the uniform grating band edge, and its spatial width $L_d$, example embodiments localize the mode tightly in a k-space, which reduces significantly coupling to the continuum of radiation modes.

Example embodiments relate to fabricating a device in which the frequency band edge profile is translated to a grating structure modulation by varying the transverse diameter $W_y$ of etched holes along the length of the resonator, as shown in FIG. 12A. To minimize scattering loss $Q_{sc}^{-1}$, the waveguide is fabricated with a shallow rib geometry, to "bury" the mode in the Si slab as shown in FIG. 10 and thus isolate it from the roughness of the etched sidewalls. Bulk absorption $Q_{ba}^{-1}$, predominantly due to free carrier absorption in heavily-doped III-V material, is reduced by the transverse mode profile minimizing the fraction of the optical energy stored in the III-V material. For example, with a Si device layer choice of a 500 nm, 75% of the modal energy is confined to the low absorption Si component and away from the lossy III-V component.

Uniform grating reflectors of length $L_m$ on either side of the defect determine the fraction of the total power generated in the active region that is coupled as useful output, and therefore the external loading of the resonator ($Q_e$). As total loaded Q is maximized to reduce phase noise, the high-Q hybrid resonators are implemented with significant undercoupling, in which $Q_e > Q_i$. Using such a loading regime with conventional DFB LDs causes susceptibility to spatial hole burning-induced mode instability and linewidth rebroadening due to their sharply-peaked spatial mode profile. In example embodiments on the other hand, such spatial hole burning is mitigated by significantly broader Gaussian longitudinal mode profiles, which allows considerable undercoupling and, therefore, large stored energies in the cavity.

Figure 12C:
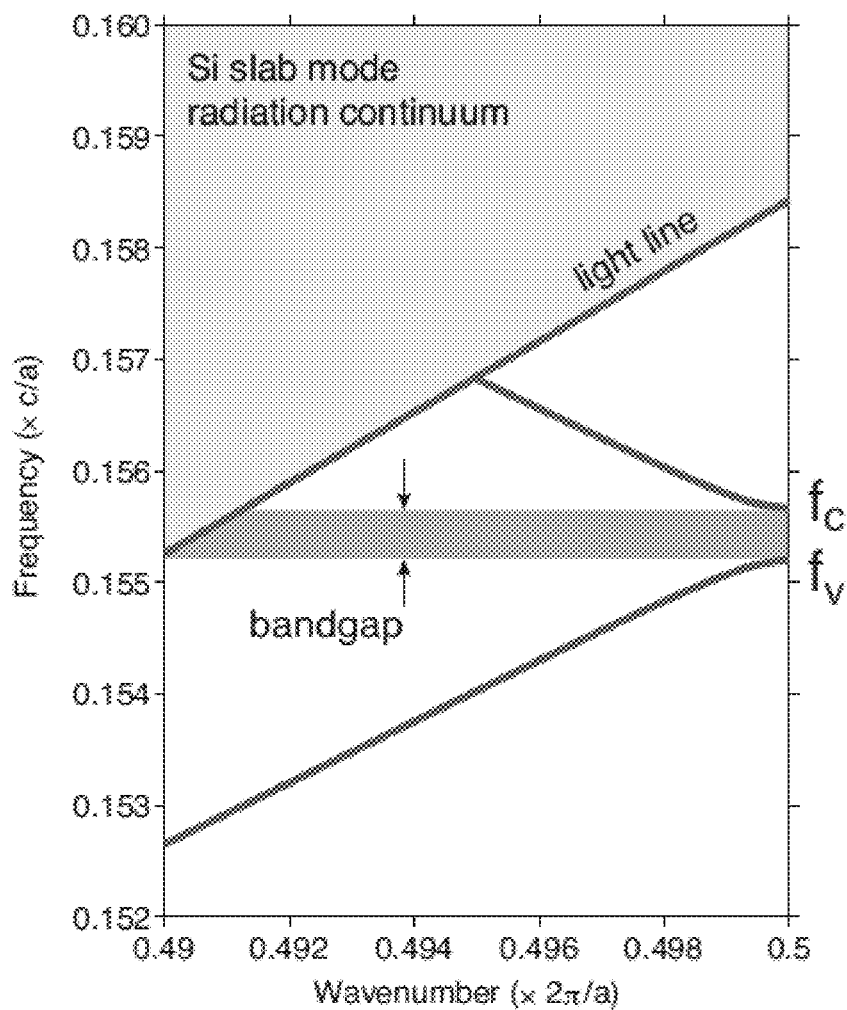
FIG. 12C depicts a dispersion diagram of an example local unit cell, according to an embodiment of the present invention.
Figure 12D:
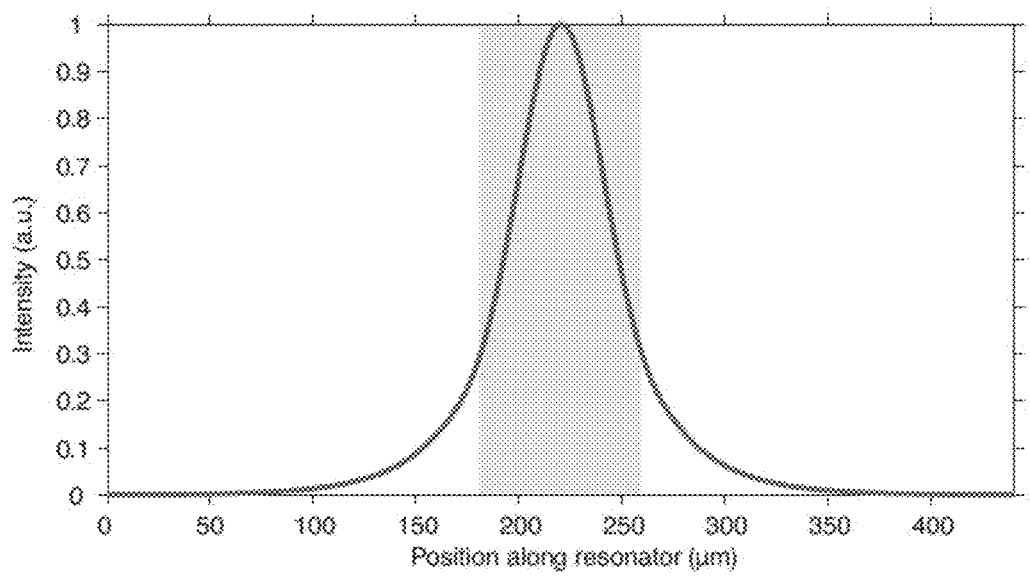
FIG. 12D depicts an intensity profile simulated for the longitudinal field of an example High-Q hybrid resonator, according to an embodiment of the present invention.
Figure 12E:
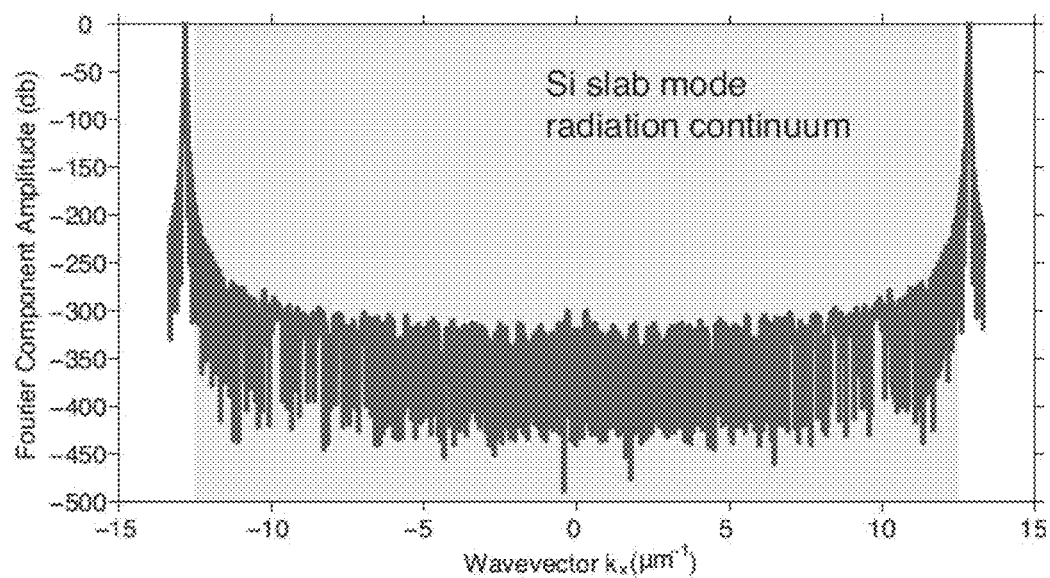
FIG. 12E depicts a Fourier component amplitude distribution of the longitudinal field of an example High-Q hybrid resonator, according to an embodiment of the present invention.
Figure 12F:
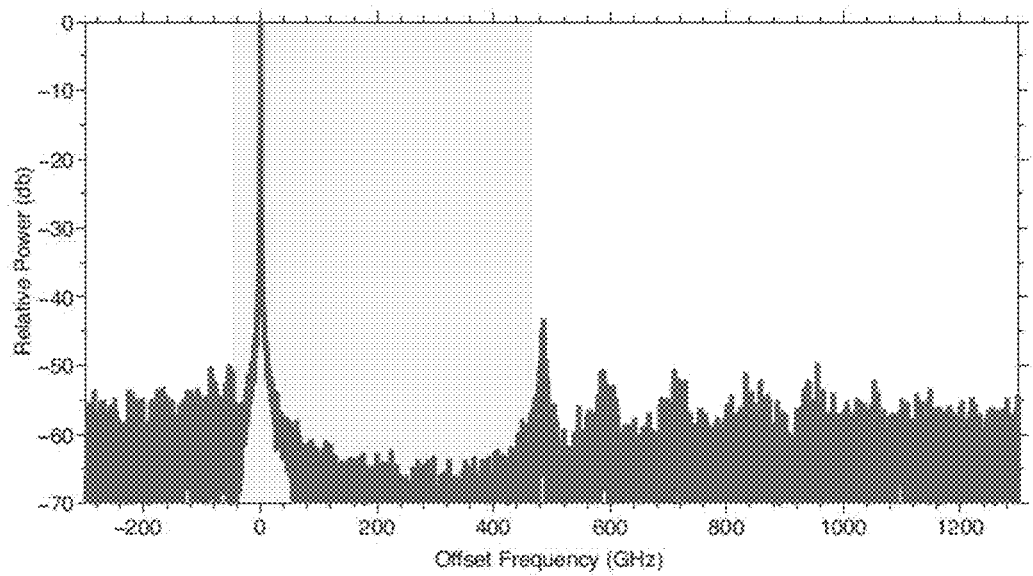
FIG. 12F depicts an emission spectrum simulated for the example High-Q SFL, according to an embodiment of the present invention.

FIGS. 12A and 12B, inclusive, depict features of an example high-Q hybrid resonator, according to an example embodiment of the present invention. FIG. 12A depicts a top view schematic of an example geometry of an ultra-low-loss grating disposed in Si. FIG. 12B depicts spatial band structure for an example high-Q hybrid resonator, plotted against the simulated transmission spectrum, for design parameters (V, $L_d$)=(300 GHz, 100 μm), respectively, wherein V represents the depth of the photonic well with respect to the low frequency mirror band edge and $\underline{L}_d$ the length of the grating defect section. FIG. 12C depicts a dispersion diagram of an example local unit cell. The Eigenfrequencies $f_v$, $f_c$ correspond, respectively, to modulated frequency distribution $f_v(x)$, $f_c(x)$ of the resonator spatial band structure. FIG. 12D depicts a simulated intensity profile for the longitudinal field of an example high-Q hybrid resonator. The upper (e.g., grey-shaded) area denotes the defect. FIG. 12E depicts the Fourier component amplitude distribution of the longitudinal field of an example high-Q hybrid resonator. The grey-shaded (e.g., middle) area denotes the continuum of radiation modes. FIG. 12F depicts the simulated emission spectrum of an example high-Q SFL. The grey-shaded area (e.g., between the 2 higher peaks) denotes the resonator bandgap.

As described herein (e.g., with reference to FIG. 9), an example embodiment implements the fabrication of high-Q SFLs. Low-optical loss gratings may be disposed on the Si component using e-beam lithography and plasma etching, which may be followed by die-scale direct bonding to the III-V material component. The hybrid Si/III-V resonators may be implemented based on photonic wells with an example design parameter set of (V, $L_d$)=(100 GHz, 200 μm), which produces a single localized defect mode. Radiation-limited quality factors on the order of $10^7$ are estimated on the basis of Fourier analysis for the selected design parameter set. The length of the distributed Bragg reflectors on either side of the defect is set to significantly undercouple the resonator, with a $Q_e$ computed to approximate $5 \times 10^6$, based on the assumption of a predominantly III-V absorption-limited intrinsic Q for the example resonator. Example cavity lengths, including the reflectors, are in the range of 1 mm.

As described herein (e.g., with reference to FIG. 9), an example embodiment implements the fabrication of high-Q SFLs. Low-optical loss gratings may be disposed on the Si component using e-beam lithography and plasma etching, which may be followed by die-scale direct bonding to the III-V material component. The hybrid Si/III-V resonators may be implemented based on photonic wells with an example design parameter set of (V, $L_d$)=(100 GHz, 200 μm), which produces a single localized defect mode.

Radiation-limited quality factors on the order of $10^7$ are estimated on the basis of Fourier analysis for the selected design parameter set. The length of the distributed Bragg reflectors on either side of the defect is set to significantly undercouple the resonator, with a $Q_e$ computed to approximate $5 \times 10^6$, based on the assumption of a predominantly III-V absorption-limited intrinsic Q for the example resonator. Example cavity lengths, including the reflectors, are in the range of 1 mm.

Figure 13A:
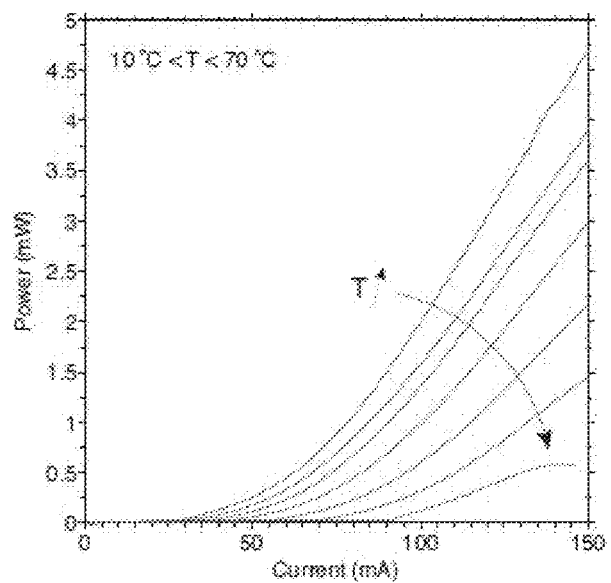
FIG. 13A depicts optical power plotted against pump current over various operating temperatures, according to an example embodiment of the present invention.
Figure 13B:
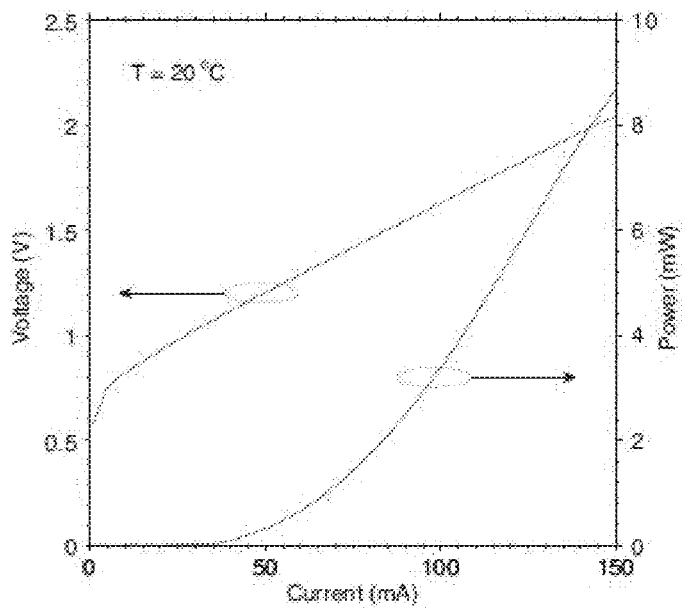
FIG. 13B depicts light (optical power output) plotted against pump current over various operating temperatures, according to an example embodiment of the present invention.
Figure 13C:
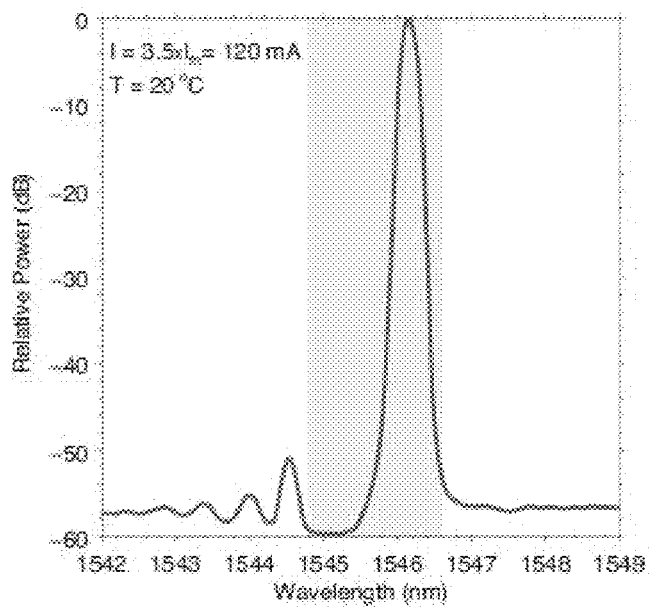
FIG. 13C depicts optical spectra of example High-Q SFLs at a given pump current and at a certain temperature, according to an embodiment of the present invention.
Figure 13D:
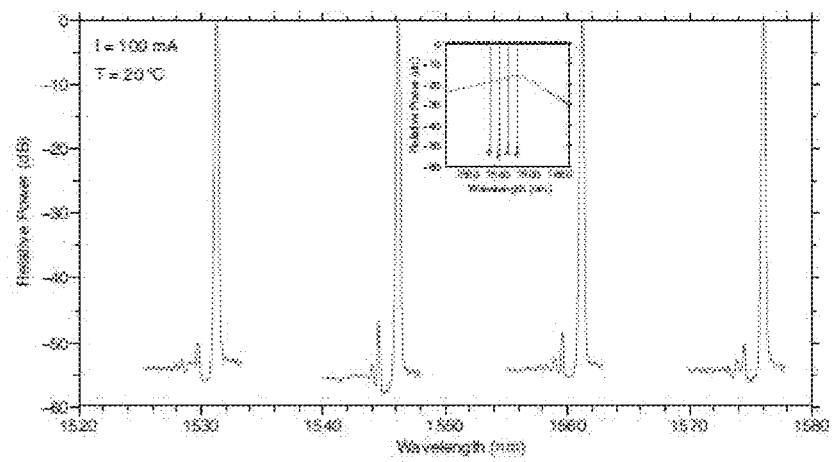
FIG. 13D depicts optical spectra of example High-Q SFLs of various grating periods at a given driving current and a certain temperature, according to an embodiment of the present invention.

FIG. 13A depicts optical power plotted against pump current over various operating temperatures, according to an example embodiment of the present invention. FIG. 13B depicts light (optical power output) plotted against pump current over various operating temperatures, according to an example embodiment of the present invention. FIG. 13C depicts optical spectra of example High-Q SFLs at a given pump current and at a certain temperature, according to an embodiment of the present invention. FIG. 13D depicts optical spectra of example High-Q SFLs of various grating periods at a given driving current and a certain temperature, according to an embodiment of the present invention.

Testing the example high-Q SFLs unpackaged and/or on a temperature controlled stage, example embodiments have been implemented to achieve single-mode, continuous-wave (CW) laser operation with threshold currents as low as 30 mA and single-side output powers as high as 9 mW at room temperature (20 C), as shown in FIG. 13B). Lasing may occur over temperatures spanning a range from 10° C. to 75° C., as shown in FIG. 13A. Single-mode oscillation is observed to be implemented over a wavelengths, which span a range of 45 nm between approximately 1530 nm-1575 nm, inclusive, in lasers with appropriately varying or different grating periods.

FIG. 13C shows a representative optical spectrum of an example high-Q SFL. Side mode suppression ratios exceeding 50 Decibels (dB) are obtained at each of the operating wavelengths, as shown in FIG. 13D). Experimental optical spectrum agree with the spectra simulated for both the passive and active resonators, as shown in FIGS. 13B and 13F, respectively. The lasing mode appears, as predicted from such simulation, near the low frequency band edge (offset ~60 GHz), with the strongest side mode appearing just outside the low frequency band edge.

Example embodiments characterize the temporal coherence of the high-Q SFL with measurement of the spectral density of the frequency fluctuations, which avoids ambiguities inherent to conventional self-heterodyne measurement techniques in discriminating between low frequency (e.g. 1/f) and high frequency noise contributions to the spectral linewidth. Displaying the noise as a function of frequency allows resolution or separation of the individual noise mechanisms. The high frequency components of the noise spectrum may be more significant than the low frequency noise components, because the high frequency portion of the noise spectrum affects high-data rate optical communications more significantly.

Figure 14:
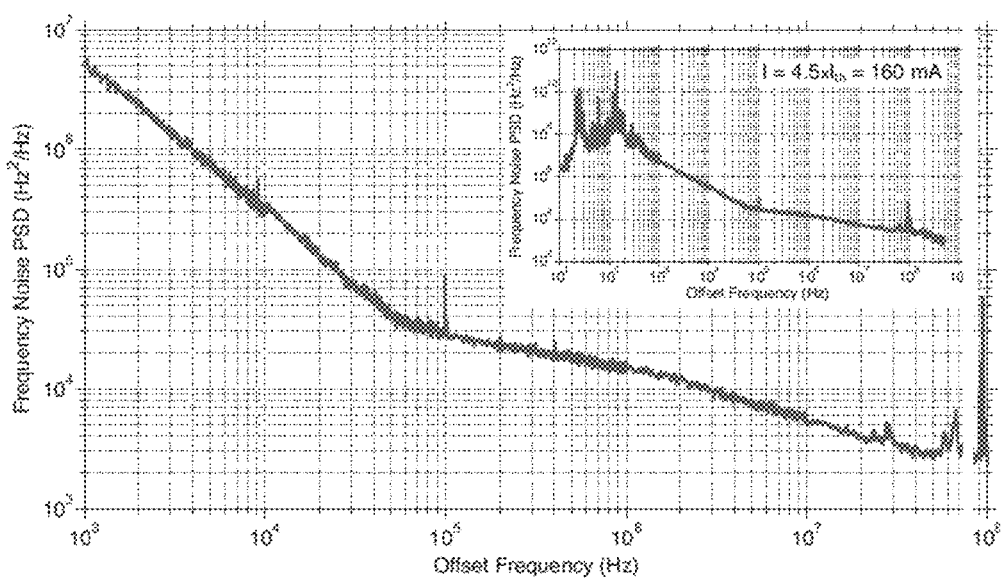
FIG. 14 depicts a frequency noise spectrum of an example High-Q SFL, according to an embodiment of the present invention.

FIG. 14 depicts a frequency noise spectrum of an example high-Q SFL, according to an embodiment of the present invention. Two (2) distinct regions in the plot can be discerned. A first region, which reaches up to approx. 100 kHz, displays a 1/f-type dependence, while a second segment has a gentler slope that extends up to 100 MHz. The hybrid high-Q SFL laser diodes of example embodiments are characterized by the trend shown in FIG. 14. The observed frequency noise spectrum is largely dominated by noise having a technical origin (e.g., noise caused by laser driving electronics). A level white noise floor is not clearly represented in these data. Thus, an upper bound on the spontaneous emission-induced phase noise may be expressed in terms of a Schawlow-Townes linewidth by using the value of the spectral density at the high-frequency end and multiplying it by $2\pi$ for the two-sided spectra measured experimentally in relation to the example embodiments implemented according to the present invention. The narrowest linewidth thus attained has a valued of 18 kHz, measured at a pump current of $4.5 \times I_{th}$ (e.g., 160 mA).

In FIG. 14, frequency noise is expressed in relation to power spectral density (PSD) in $Hz^2/Hz$ as a function of the offset frequency from the carrier, taken at a pump current of 160 mA ($4.5 \times I_{th}$) at 20° C. The spikes shown at near the 100 kHz and 100 MHz frequencies correspond respectively to current source electronic noise and FM radio noise. The PSD value near 100 MHz, multiplied by $2\pi$, yields a Schawlow-Townes linewidth of 18 kHz. The FIG. 4 inset portion includes the full frequency noise spectrum as obtained, e.g., using RF spectrum analysis, which shows the feedback-suppressed low frequency end of the spectrum, as well as the onset of the Mach-Zehnder Interferometric (MZI) roll-off at 200 MHz for a free spectral range (FSR) of 847 MHz.

Figure 15A:
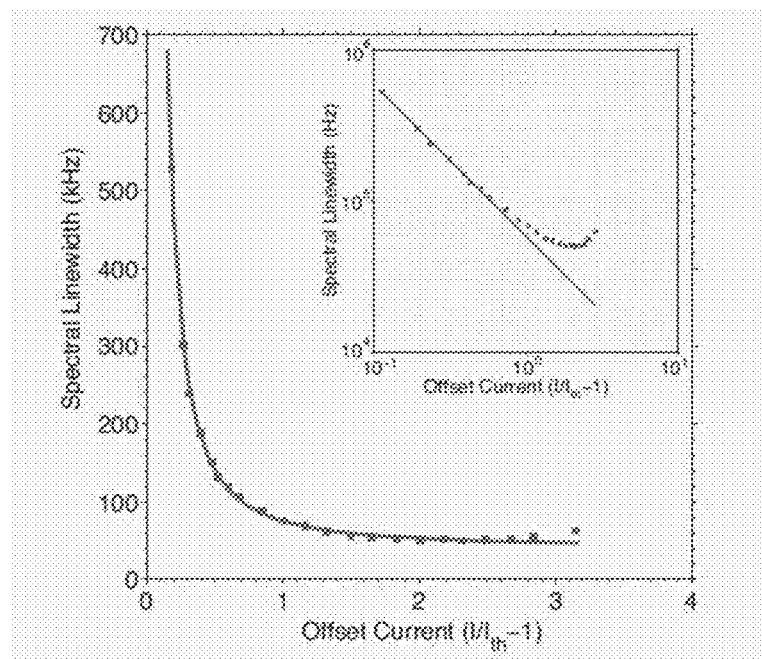
FIG. 15A depicts a Schawlow-Townes linewidth of an example High-Q SFL as a function of the offset pump current from a threshold, according to an embodiment of the present invention.
Figure 15B:
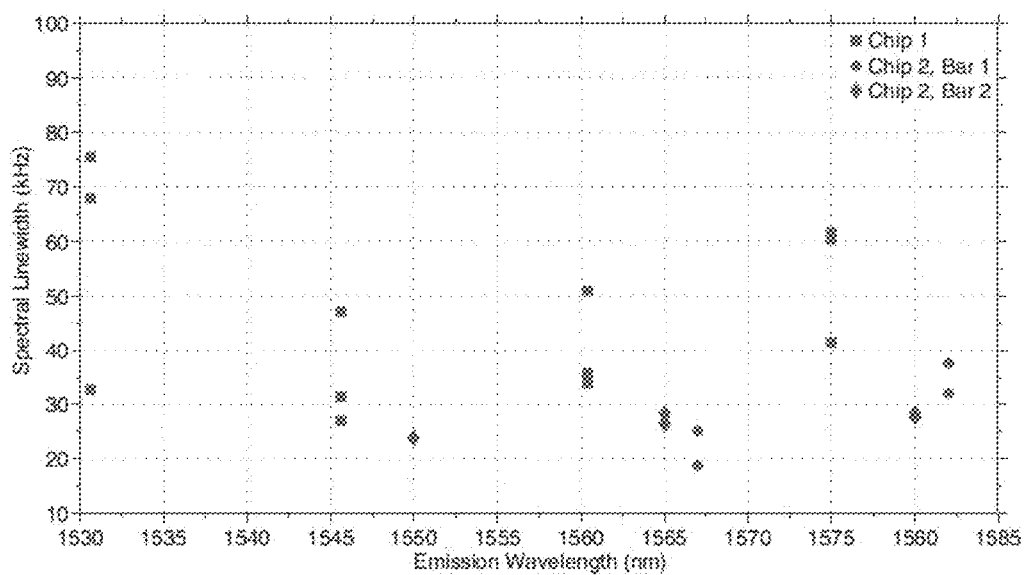
FIG. 15B depicts a distribution of Schawlow-Townes linewidths as a function of their respective emission wavelengths, for example High-Q SFL devices implemented over multiple laser bars fabricated on several separate semiconductor chips, according to an embodiment of the present invention.

FIG. 15A depicts a Schawlow-Townes linewidth of an example High-Q SFL as a function of the offset pump current from a threshold, according to an embodiment of the present invention. FIG. 15B depicts a distribution of Schawlow-Townes linewidths as a function of their respective emission wavelengths for example High-Q SFL devices implemented over multiple laser bars fabricated on several separate semiconductor chips, according to an embodiment of the present invention.

Deviation from the expected linewidth dependence on pump current is observed in the form of a linewidth floor. This deviation is due, at least in part, to increased side mode competition observed in the optical spectra of the lasers and may be likely caused by spatial hole burning. Narrow-linewidth performance is demonstrated across the entire C-band, as shown in FIG. 15B obtained from lasers with varying grating periods, and which span different chips and laser bars.

Figure 16A:
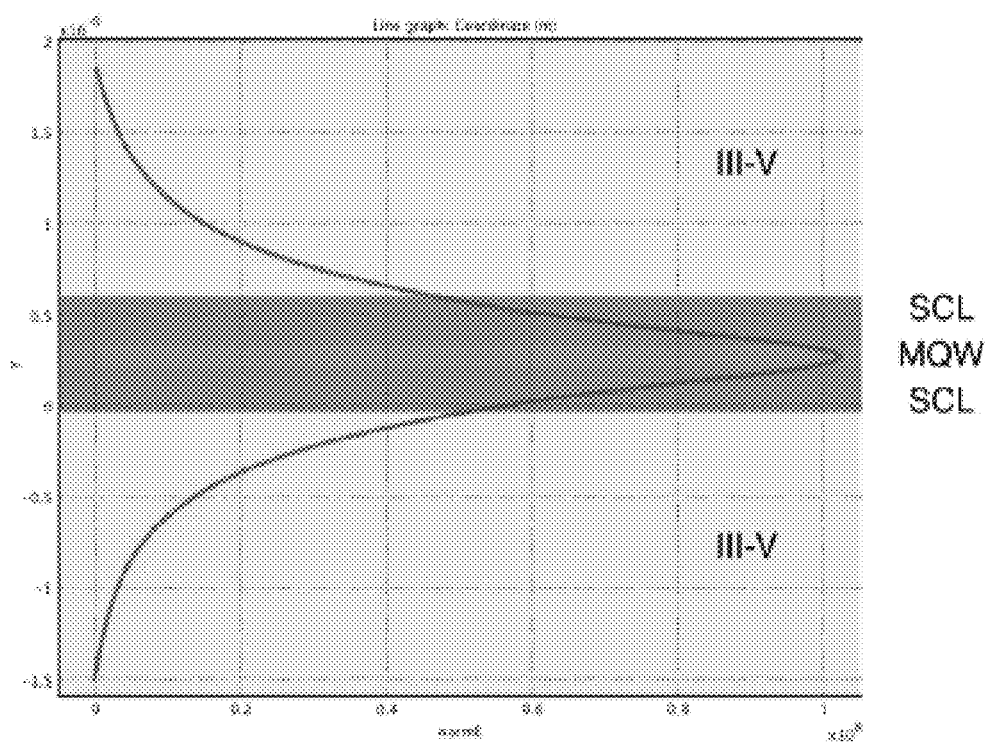
FIG. 16A depicts a modal energy distribution typical of conventional lasers; and, FIG. 16B depicts an example modal energy distribution for a laser, according to an embodiment of the present invention.

FIG. 16A depicts a modal energy distribution typical of conventional lasers. Most of the energy is distributed in the active region of conventional semiconductor lasers. In contrast, example embodiments of the present invention distribute most of the energy apart from the active region.

For example, a laser resonator according to an example embodiment includes an active material, which amplifies light associated with an optical gain of the resonator, and passive materials disposed in proximity with the active material. The resonator oscillates over one or more optical modes, each of which corresponds to a particular spatial energy distribution and resonant frequency.

Figure 16B:
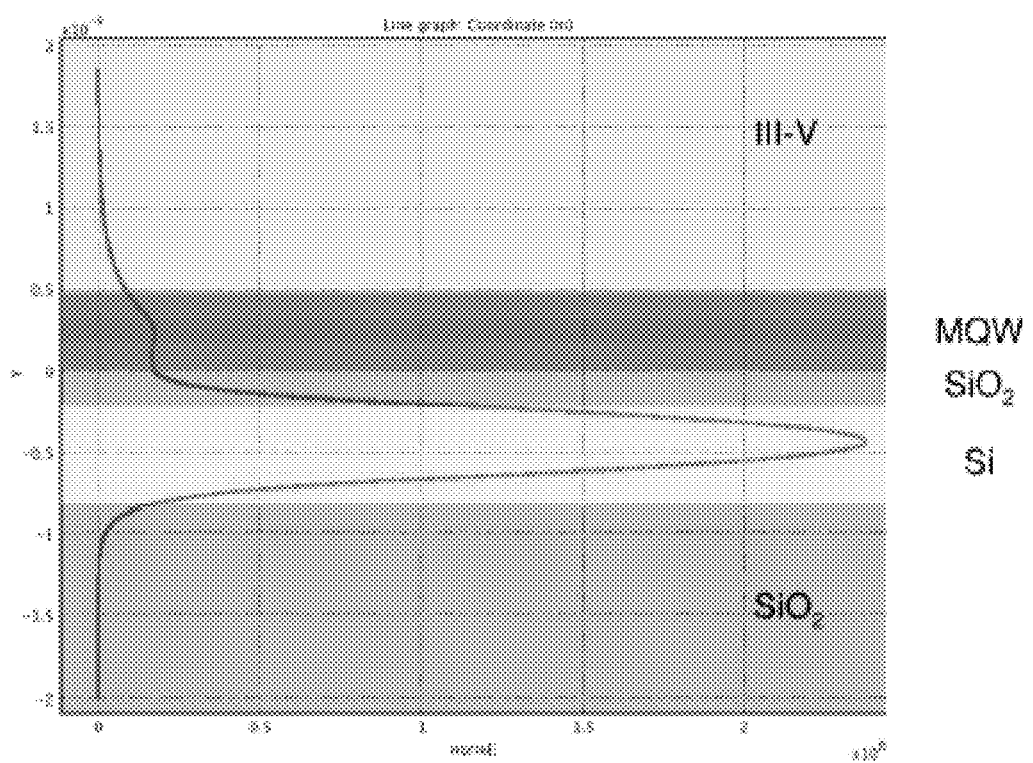

FIG. 16B depicts an example modal energy distribution for a laser, according to an embodiment of the present invention. Based on a characteristic of the passive materials, for the particular spatial energy distribution corresponding to at least one of the optical modes, a preponderant portion of optical energy is distributed apart from the active material (e.g., III-V material).

The passive materials may include a low loss material (e.g., Si), which stores the preponderant optical energy portion distributed apart from the active material, and buffer material (e.g., $SiO_2$) disposed between the low loss (Si) material and the active (III-V) material, which controls a ratio of the optical energy stored in the low loss material to a portion of the optical energy in the active material.

Example embodiments of the present invention thus relate to a new type of high-coherence semiconductor laser, which is based on deliberate spatial separation of two (2) of the more significant functions of the laser: light generation in a photogeneratively efficient III-V material component and light storage in a low-optical loss Si component. These functions, together substantially determinative the laser coherence. The improved coherence is due, predominantly, to a major increase of the Q factor of the example laser resonators described herein, which display laser linewidths as narrow as 18 kHz.

To characterize the performance of these example embodiments technologically, lasers with the degree of phase coherence thus enabled comfortably enable implementation of 16-QAM (quadrature amplitude modulation) coherent communication schema, LIDAR and other high-performance applications at significant savings over the electrical power demands characterizing conventional DFB LDs. Moreover, lasers implemented as described herein are also amenable to on-chip integration of optical and electronic functions.

Example embodiments of the present invention are thus described in relation to a resonator for a laser device. The laser resonator has at least one active material for amplifying light associated with an optical gain of the resonator. The laser resonator also has one or more passive materials disposed in proximity with the at least one active material wherein the resonator oscillates over one or more optical modes, each of the one or more optical modes corresponding to a particular spatial energy distribution and resonant frequency, and wherein, based on a characteristic of the one or more passive materials, for the particular spatial energy distribution corresponding to at least one of the one or more optical modes, a preponderant portion of optical energy is distributed apart from the active material.

The one or more passive materials may include a low loss material for storing optical energy of the preponderant portion distributed apart from the active material. The one or more passive materials may also include a buffer material disposed between the low loss material and the at least one active material for controlling a ratio of the optical energy stored in the low loss material to a portion of the optical energy in the active material. The buffer material may include a material like silicon dioxide, which has a low refractive index. The active material may include a III-V material and the low loss material may include silicon. The passive materials may be disposed in layers, at least one of which is bonded (e.g., with wafer bonding) with a layer with active material.

The low loss passive material may be configured with a pattern of holes. The configured hole pattern may determine an oscillation frequency, an output rate and an output mode profile of the resonator and deters spontaneous emission therefrom. The pattern of holes may have a one-dimensional (1D) configuration, such as a linear or near linear aspect. The configured pattern of holes may include an approximately uniform array of holes of approximately uniform size, and a defect (e.g., related to the approx. uniform size) disposed within (e.g., over, in or nearly in a center area of) the approximately uniform array of holes.

Example embodiments of the present invention also relate to laser devices with such resonators disposed on semiconductor dies. The laser devices may have a heat sink component attached to the semiconductor die and configured therewith for removing heat generated in the active material from the resonator of the laser device. The heat sink may be attached to the semiconductor die with an epitaxial-side-down configuration in relation to the active material of the laser resonator (or in other configurations). The laser device may also have a detector component attached to the semiconductor die and configured therewith for determining an output characteristic of the laser resonator. The output characteristic may relate to measuring a frequency noise related component of the resonator output, which may include computing a high frequency noise spectrum of the resonator output and suppressing measurement of low frequency fluctuations of the resonator output.

Example embodiments of the present invention relate to a method for lasing, which includes amplifying light associated with an optical gain in at least one active material of an optical resonator, and distributing spatial energy within the resonator, in which one or more passive materials are disposed in proximity with the at least one active material, in which the resonator oscillates over one or more optical modes, each of the one or more optical modes corresponding to a particular spatial energy distribution and resonant frequency, and in which, based on a characteristic of the one or more passive materials, for the particular spatial energy distribution corresponding to at least one of the one or more optical modes, a preponderant portion of optical energy is distributed apart from the active material.

The one or more passive materials may include a low loss material for storing optical energy of the preponderant portion distributed apart from the active material, as well as a buffer material, which is disposed between the low loss material and the at least one active material, and effectively controls a ratio of the optical energy stored in the low loss material to a portion of the optical energy in the active material. Example embodiments relate to lasers, e.g., systems, devices products, etc. for sustaining such lasing processes, as well as to methods for fabricating them.

A separated function laser is described herein, including the references listed below. The laser has a substrate layer, a storage and waveguiding layer adjacent to the substrate layer, and a photon generation layer adjacent to the storage and waveguiding layer. The storage and waveguiding layer comprises a grating pattern adjacent to the photon generation layer.

Example embodiments of the present invention are described above in relation to a resonator for a laser device. The laser resonator has at least one active material for amplifying light associated with an optical gain of the resonator. The laser resonator also has one or more passive materials disposed in proximity with the at least one active material wherein the resonator oscillates over one or more optical modes, each of the one or more optical modes corresponding to a particular spatial energy distribution and resonant frequency, and wherein, based on a characteristic of the one or more passive materials, for the particular spatial energy distribution corresponding to at least one of the one or more optical modes, a preponderant portion of optical energy is distributed apart from the active material.

The one or more passive materials may include a low loss material for storing optical energy of the preponderant portion distributed apart from the active material. The one or more passive materials may also include a buffer material disposed between the low loss material and the at least one active material for controlling a ratio of the optical energy stored in the low loss material to a portion of the optical energy in the active material. The buffer material may include a material like silicon dioxide, which has a low refractive index. The active material may include a III-V material and the low loss material may include silicon. The passive materials may be disposed in layers, at least one of which is bonded (e.g., with wafer bonding) with a layer with active material.

The low loss passive material may be configured with a pattern of holes. The configured hole pattern may determine an oscillation frequency, an output rate and an output mode profile of the resonator and deters spontaneous emission therefrom. The pattern of holes may have a one-dimensional (1D) configuration, such as a linear or near linear aspect. The configured pattern of holes may include an approximately uniform array of holes of approximately uniform size, and a defect (e.g., related to the approx. uniform size) disposed within (e.g., over, in or nearly in a center area of) the approximately uniform array of holes.

Example embodiments of the present invention also relate to laser devices with such resonators disposed on semiconductor dies. The laser devices may have a heat sink component attached to the semiconductor die and configured therewith for removing heat generated in the active material from the resonator of the laser device. The heat sink may be attached to the semiconductor die with an epitaxial-side-down configuration in relation to the active material of the laser resonator (or in other configurations). The laser device may also have a detector component attached to the semiconductor die and configured therewith for determining an output characteristic of the laser resonator. The output characteristic may relate to measuring a frequency noise related component of the resonator output, which may include computing a high frequency noise spectrum of the resonator output and suppressing measurement of low frequency fluctuations of the resonator output.

Example embodiments of the present invention relate to a method for lasing, which includes amplifying light associated with an optical gain in at least one active material of an optical resonator, and distributing spatial energy within the resonator, in which one or more passive materials are disposed in proximity with the at least one active material, in which the resonator oscillates over one or more optical modes, each of the one or more optical modes corresponding to a particular spatial energy distribution and resonant frequency, and in which, based on a characteristic of the one or more passive materials, for the particular spatial energy distribution corresponding to at least one of the one or more optical modes, a preponderant portion of optical energy is distributed apart from the active material.

The one or more passive materials may include a low loss material for storing optical energy of the preponderant portion distributed apart from the active material, as well as a buffer material, which is disposed between the low loss material and the at least one active material and effectively controls a ratio of the optical energy stored in the low loss material to a portion of the optical energy in the active material. Example embodiments relate to lasers, e.g., systems, devices products, etc. for sustaining such lasing processes, as well as to methods for fabricating them.

Thus, a laser resonator is described, which includes an active material for amplifying light associated with an optical gain of the resonator, and passive materials disposed in proximity with the active material. The resonator oscillates over one or more optical modes, each of which corresponds to a particular spatial energy distribution and resonant frequency. Based on a characteristic of the passive materials, for the particular spatial energy distribution corresponding to at least one of the optical modes, a preponderant portion of optical energy is distributed apart from the active material. The passive materials may include a low loss material, which stores the preponderant optical energy portion distributed apart from the active material, and a buffer material disposed between the low loss material and the active material, which controls a ratio of the optical energy stored in the low loss material to a portion of the optical energy in the active material.

Definitions that are expressly set forth in each or any claim specifically or by way of example herein, for terms contained in relation to features of such claims are intended to govern the meaning of such terms. Thus, no limitation, element, property, feature, or attribute that is not expressly recited in a claim should limit the scope of such claim in any way. The specification and drawings are, accordingly, to be regarded in an illustrative rather than a restrictive sense. Example embodiments of the present invention relate to providing power to medical and physiological instruments and exchanging signals therewith.

In the foregoing specification, example embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

REFERENCES

[1] P. J. Winzer and R. J. Essiambre, "Advanced optical modulation formats," *Proc. IEEE*, vol. 94, pp. 952-985, 2006.
[2] E. Ip, A. P. T. Lau, D. J. F. Barros, and J. M. Kahn, "Coherent detection in optical fiber systems," *Optics Express*, vol. 16, pp. 753-791, 2008.
[3] J. Rahn, S. Kumar, M. Mitchell, H. Sun, K. T. Wu, G. Goldfarb, M. Kato, D. Krause, R. Nagarajan, F. Kish, and D. Welch, "Super-Channels: DWDM Transmission Beyond 100 Gb/s," *IEEE Photonics Conference (IPC)*, pp. 854-855, 2012.
[4] C. Spiegelberg, J. H. Geng, Y. D. Hu, Y. Kaneda, S. B. Jiang, and N. Peyghambarian, "Low-noise narrow-linewidth fiber laser at 1550 nm (June 2003)," *Journal of Lightwave Technology*, vol. 22, pp. 57-62, January 2004.
[5] K. Numata, J. Camp, M. A. Krainak, and L. Stolpner, "Performance of planar-waveguide external cavity laser for precision measurements," *Optics Express*, vol. 18, pp. 22781-22788, Oct. 25, 2010.
[6] K. Kikuchi, "Origin of residual semiconductor laser linewidth in high-power limit," *Electronics Lett.*, vol. 24, pp. 1001-1002, 1988.

[7] K. Kikuchi, "Effect of 1/f-type FM noise on semiconductor laser linewidth residual in high-power limit," *IEEE J. Quantum Electronics*, vol. 25, pp. 684-688, 1989.

[8] K. Kikuchi, "Impact of 1/f-type FM noise on coherent optical communications," *Electronics Lett.*, vol. 23, pp. 885-887, 1987.

[9] K. Kikuchi and T. Okoshi, "Dependence of semiconductor-laser linewidth on measurement time—evidence of predominance of 1/f noise," *Electronics Lett.*, vol. 21, pp. 1011-1012, 1985.

[10] K. Kikuchi, T. Okoshi, M. Nagamatsu, and N. Henmi, "Degradation of bit-error rate in coherent optical communications due to spectral spread of the transmitter and the local oscillator," *J. Lightwave Technology*, vol. 2, pp. 1024-1033, 1984.

[11] R. W. P. Drever, J. L. Hall, F. V. Kowalski, J. Hough, G. M. Ford, A. J. Munley, and H. Ward, "Laser Phase and Frequency Stabilization Using an Optical-Resonator," *Applied Physics B—Photophysics and Laser Chemistry*, vol. 31, pp. 97-105, 1983.

[12] N. Satyan, W. Liang, and A. Yariv, "Coherence Cloning Using Semiconductor Laser Optical Phase-Lock Loops," *IEEE Journal of Quantum Electronics*, vol. 45, pp. 755-761, July 2009.

[13] A. Yariv, *Quantum Electronics (3rd Edition)*. New York, N.Y.: John Wiley and Sons, 1988.

[14] C. H. Henry, "Theory of the linewidth of semiconductor lasers," *IEEE J Quantum Electronics*, vol. 18, pp. 259-264, 1982.

[15] C. T. Santis, S. T. Steger, Y. Vilenchik, A. Vasilyev, and A. Yariv, "High-coherence semiconductor lasers based on integral high-Q resonators in hybrid Si/III-V platforms," *Proceedings of the National Academy of Sciences*, Feb. 10, 2014.

[16] A. Tsekoun, R. Go, M. Pushkarsky, M. Razeghi, and C. K. N. Patel, "Improved performance of quantum cascade lasers through a scalable, manufacturable epitaxial-side-down mounting process," *Proceedings of the National Academy of Sciences of the United States of America*, vol. 103, pp. 4831-4835, Mar. 28, 2006.

[17] T. J. W. Ronnie, "Advances in High-Power Laser Diode Packaging," in *Semiconductor Laser Diode Technology and Applications*, D. S. Patil, Ed., ed: InTech, 2012.

[18] A. W. Fang, H. Park, O. Cohen, R. Jones, M. J. Paniccia, and J. E. Bowers, "Electrically pumped hybrid AlGaInAs-Silicon evanescent laser," *Optics Express*, vol. 14, pp. 9203-9210, 2006.

[19] A. Yariv, "Dynamic analysis of the semiconductor laser as a current-controlled oscillator in the optical phased-lock loop: applications," *Optics Letters*, vol. 30, pp. 2191-2193, Sep. 1, 2005.

[20] A. W. Fang, E. Lively, H. Kuo, D. Liang, and J. E. Bowers, "A distributed feedback Silicon evanescent laser," *Optics Express*, vol. 16, pp. 4413-4419, 2008.

[21] N. Satyan, W. Liang, F. Aflatouni, A. Yariv, A. Kewitsch, G. Rakuljic, and H. Hashemi, "Phase-controlled apertures using heterodyne optical phase-locked loops," *IEEE Photonics Technology Letters*, vol. 20, pp. 897-899, May-June 2008.

[22] N. Satyan, J. Sendowski, A. Vasilyev, G. Rakuljic, and A. Yariv, "Phase noise reduction of a semiconductor laser in a composite optical phase-locked loop," *Optical Engineering*, vol. 49, December 2010.

[23] N. Satyan, W. Liang, A. Kewitsch, G. Rakuljic, and A. Yariv, "Coherent Power Combination of Semiconductor Lasers Using Optical Phase-Lock Loops," *IEEE Journal of Selected Topics in Quantum Electronics*, vol. 15, pp. 240-247, March-April 2009.

[24] N. Satyan, A. Vasilyev, G. Rakuljic, V. Leyva, and A. Yariv, "Precise control of broadband frequency chirps using optoelectronic feedback," *Optics Express*, vol. 17, pp. 15991-15999, 2009.

[25] W. H. Louisell, A. E. Siegman, and A. Yariv, "Quantum Fluctuations and Noise in Parametric Processes" *Physical Review*, vol. 124, pp. 1646-&, 1961.

[26] A. Yariv, "Internal Modulation in Multimode Laser Oscillators," *Journal of Applied Physics*, vol. 36, pp. 388-&, 1965.

[27] A. Yariv, "The Beginning of Integrated Optoelectronic Circuits," *IEEE Transactions on Electron Devices*, vol. 31, pp. 1656-1661, 1984.

[28] A. Yariv, "Phase Conjugate Optics and Real-Time Holography," *Ieee Journal of Quantum Electronics*, vol. 14, pp. 650-660, 1978.

[29] M. Nakamura, A. Yariv, H. W. Yen, S. Somekh, and H. L. Garvin, "Optically pumped GaAs surface laser with corrugation feedback," *Appl. Phys. Lett.*, vol. 22, pp. 515-516, 1973.

[30] M. Nakamura, H. W. Yen, A. Yariv, E. Garmire, S. Somekh, and H. L. Garvin, "Laser oscillation in epitaxial GaAs waveguides with corrugation feedback," *Appl. Phys. Lett.*, vol. 23, no. 5, pp. 224-225, 1973.

[31] E. Ip, A. P. T. Lau, D. J. F. Barros, and J. M. Kahn, "Coherent detection in optical fiber systems," *Optics Express*, vol. 16, no. 2, pp. 753-791, 2008.

[32] K. Kikuchi, "Digital coherent optical communication systems: fundamentals and future prospects," *IEICE Electronics Express*, vol. 8, no. 20, pp. 1642-1662, 2011.

[33] P. J. Winzer, "High-spectral-efficiency optical modulation formats," *J. Lightwave Tech.*, vol. 30, no. 24, pp. 3824-3835, 2012.

[34] K. Kikuchi, T. Okoshi, M. Nagamatsu, and N. Henmi, "Degradation of bit-error rate in coherent optical communications due to spectral spread of the transmitter and the local oscillator," *J. Lightwave Technology*, vol. 2, no. 6, pp. 1024-1033, 1984.

[35] S. Ogita, Y. Kotaki, M. Matsuda, Y. Kuwahara, and H. Ishikawa, "Long cavity, multiple-phase-shift, distributed feedback laser for linewidth narrowing," *Electronics Lett.*, vol. 25, no. 10, pp. 629-630, 1989.

[36] H. Soda, Y. Kotaki, H. Sudo, H. Ishikawa, S. Yamakoshi, and H. Imai, "Stability in single longitudinal mode-operation in GaInAsP—InP phase adjusted DFB lasers," *IEEE J. Quantum Electronics*, vol. 23, no. 6, pp. 804-814, 1987.

[37] S. Ogita, Y. Kotaki, H. Ishikawa, and H. Imai, "Optimum design for multiple-phase-shift distributed feedback laser," *Electronics Lett.*, vol. 24, no. 12, pp. 731-732, 1988.

[38] M. Okai, T. Tsuchiya, K. Uomi, N. Chinone, and T. Harada, "Corrugation-pitch-modulated MQW-DFB laser with narrow spectral linewidth (170 kHz)," *IEEE Photonics Technology Lett.*, vol. 2, no. 8, pp. 529-530, 1990.

[39] K. Y. Liou, N. K. Dutta, and C. A. Burrus, "Linewidth-narrowed distributed feedback injection lasers with long cavity length and detuned Bragg wavelength," *Appl. Phys. Lett.*, vol. 50, no. 9, pp. 489-491, 1987.

[40] S. Ogita, M. Yano, H. Ishikawa, and H. Imai, "Linewidth reduction in DFB laser by detuning effect," *Electronics Lett.*, vol. 23, no. 8, pp. 393-394, 1987.

[41] H. Ishii, K. Kasaya, and H. Oohashi, "Narrow spectral linewidth operation (<160 kHz) in widely tunable distributed feedback laser array," Electronics Lett., vol. 46, no. 10, pp. 714-U74, 2010.

[42] A. W. Fang, H. Park, O. Cohen, R. Jones, M. J. Paniccia, and J. E. Bowers, "Electrically pumped hybrid AlGaInAs-Silicon evanescent laser," Optics Express, vol. 14, no. 20, pp. 9203-9210, 2006.

[43] G. Roelkens, D. V. Thourhout, R. Baets, R. Notzel, and M. Smit, "Laser emission and photodetection in an InP/InGaAsP layer integrated on and coupled to a Silicon-on-Insulator waveguide circuit," Optics Express, vol. 14, no. 18, pp. 8154-8159, 2006.

[44] X. K. Sun, A. Zadok, M. J. Shearn, K. A. Diest, A. Ghaffari, H. A. Atwater, A. Scherer, and A. Yariv, "Electrically pumped hybrid evanescent Si/InGaAsP lasers," Optics Lett., vol. 34, no. 9, pp. 1345-1347, 2009.

[45] C. H. Henry, "Theory of the linewidth of semiconductor lasers," IEEE J. Quantum Electronics, vol. 18, no. 2, pp. 259-264, 1982.

[46] A. Yariv, Quantum Electronics (3rd Edition). New York, N.Y.: John Wiley and Sons, 1988.

[47] T. Asano, B. S. Song, and S. Noda, "Analysis of the experimental Q factors (similar to 1 million) of photonic crystal nanocavities," Optics Express, vol. 14, no. 5, pp. 1996-2002, 2006.

[48] Y. Akahane, T. Asano, B. S. Song, and S. Noda, "High-Q photonic nanocavity in a two-dimensional photonic crystal," Nature, vol. 425, no. 6961, pp. 944-947, 2003.

[49] B. S. Song, S. Noda, T. Asano, and Y. Akahane, "Ultra-high-Q photonic double-heterostructure nanocavity," Nature Materials, vol. 4, no. 3, pp. 207-210, 2005.

[50] E. Kuramochi, H. Taniyama, T. Tanabe, K. Kawasaki, Y. G. Roh, and M. Notomi, "Ultrahigh-Q one-dimensional photonic crystal nanocavities with modulated mode-gap barriers on SiO2 claddings and on air claddings," Optics Express, vol. 18, no. 15, pp. 15859-15869, 2010.

[51] M. Notomi, "Manipulating light with strongly modulated photonic crystals," Reports On Progress In Phys., vol. 73, no. 9, p. 096501, 2010.

[52] M. C. Wu, Y. H. Lo, and S. Wang, "Linewidth broadening due to longitudinal spatial hole burning in a long distributed feedback laser," Appl. Phys. Lett., vol. 52, no. 14, pp. 1119-1121, 1988.

[53] R. Schatz, "Longitudinal spatial instability in symmetrical semiconductor lasers due to spatial hole burning," IEEE J. Quantum Electronics, vol. 28, no. 6, pp. 1443-1449, 1992.

[54] W. V. Sorin, K. W. Chang, G. A. Conrad, and P. R. Hernday, "Frequency-domain analysis of an optical FM discriminator," J. Lightwave Tech., vol. 10, no. 6, pp. 787-793, 1992.

[55] L. B. Mercer, "1/f frequency noise effects on self-heterodyne linewidth measurements," J. Lightwave Tech., vol. 9, no. 4, pp. 485-493, 1991.

[56] K. Kikuchi, "Impact of 1/f-type FM noise on coherent optical communications," Electronics Lett., vol. 23, no. 17, pp. 885-887, 1987.

[57] L. Hou, M. Haji, J. Akbar, and J. H. Marsh, "Narrow linewidth laterally-coupled 1.55 m AlGaInAs/InP distributed feedback lasers integrated with a curved tapered semiconductor optical amplifier," Optics Letters, vol. 37, no. 21, pp. 4525-4527, 2012.

[58] U. Kruger and K. Petermann, "The semiconductor laser linewidth due to the presence of side modes," IEEE J. Quantum Electronics, vol. 24, no. 12, pp. 2355-2358, 1988.

[59] E. Ip and J. M. Kahn, "Feedforward carrier recovery for coherent optical communications," J. Lightwave Tech., vol. 25, no. 9, pp. 2675-2692, 2007.

[60] M. Seimetz, "Laser linewidth limitations for optical systems with high order modulation employing feed forward digital carrier phase estimation," Optical Fiber Comm. Conf., vol. 1-8, pp. 2470-2472, 2008.

What is claimed is:

1. A laser resonator device comprising:
   at least one active material providing optical gain for amplifying light within the laser resonator; and
   one or more passive materials disposed in proximity with the at least one active material, wherein the one or more passive materials comprise:
      a low loss material for storing optical energy of the preponderant portion distributed apart from the active material, the low loss material comprising a grating resonator having a quality factor Q greater than $10^4$, and
      a mode control layer disposed between the low loss material and the at least one active material for controlling a ratio of the optical energy stored in the low loss material to a portion of the optical energy in the active material,
   wherein:
      a thickness of the mode control layer and the quality factor Q of the grating resonator are configured to result in a low phase noise for the laser resonator device,
      the at least one active material and the one or more passive materials overlap and extend in a longitudinal direction for a same length along a laser beam emission direction,
      the laser resonator device oscillates over a single optical mode in the longitudinal direction and a single optical mode in a transversal direction perpendicular to the longitudinal direction, the longitudinal single mode and the transversal single mode corresponding to a particular spatial energy distribution and resonant frequency,
      based on a characteristic of the one or more passive materials, for the particular spatial energy distribution corresponding to the longitudinal single mode and the transversal single mode, a preponderant portion of optical energy is distributed transversally apart from the active material, and
      a spectral linewidth for the laser resonator is less than 530 kHz.

2. The laser resonator as described in claim 1 wherein the mode control layer has a low refractive index.

3. The laser resonator as described in claim 2 wherein the mode control layer comprises silicon dioxide.

4. The laser resonator as described in claim 1 wherein the active material comprises a III-V material.

5. The laser resonator as described in claim 1 wherein the low loss material comprises silicon.

6. The laser resonator as described in claim 1 wherein at least one of the one or more passive materials is bonded with the at least one active material.

7. The laser resonator as described in claim 6 wherein the one or more passive materials are disposed in one or more passive layers corresponding to each and wherein the at least one active material comprises a layer wafer-bonded to one of the one or more passive layers.

8. The laser resonator as described in claim 1, wherein the grating resonator comprises a pattern of holes which determines an oscillation frequency, an output rate and an output mode profile of the grating resonator and deters spontaneous emission therefrom.

9. The laser resonator as described in claim 8 wherein the configured pattern of holes comprises:
an array of holes of approximately uniform size; and
a defect disposed within the approximately uniform array of holes.

10. The laser resonator as described in claim 9 wherein the defect relates to the approximately uniform size.

11. The laser resonator as described in claim 9 wherein the defect is disposed substantially over, in or near a central area of the approximately uniform array of holes.

12. The laser resonator as described in claim 1, wherein the thickness of the mode control layer is configured to reduce noise of the laser resonator.

13. The laser resonator device of claim 1, wherein the quality factor Q is at least $10^5$.

14. The laser resonator device of claim 1, wherein the spectral linewidth is less than 75 kHz.

15. The laser resonator device of claim 1, wherein the spectral linewidth is less than 18 kHz.

16. The laser resonator device of claim 1, wherein the spectral linewidth is less than 5 kHz.

17. A laser device, comprising:
a semiconductor die; and
a laser resonator disposed on the semiconductor die, the laser resonator comprising:
at least one active material providing optical gain for amplifying light within the laser resonator; and
one or more passive materials disposed in proximity with the at least one active material, wherein the one or more passive materials comprise:
a low loss material for storing optical energy of the preponderant portion distributed apart from the active material, the low loss material comprising a grating resonator comprising a pattern of holes, the grating resonator having a quality factor Q of at least $10^4$; and
a mode control layer disposed between the low loss material and the at least one active material for controlling a ratio of the optical energy stored in the low loss material to a portion of the optical energy in the active material,
wherein:
a thickness of the mode control layer and the quality factor Q of the grating resonator are configured to result in a low phase noise for the laser resonator device,
the at least one active material and the one or more passive materials overlap and extend in a longitudinal direction for a same length along a laser beam emission direction,
the laser resonator oscillates over a single optical mode in the longitudinal direction and a single optical mode in a transversal direction perpendicular to the longitudinal direction, the longitudinal single mode and the transversal single mode corresponding to a particular spatial energy distribution and resonant frequency,
based on a characteristic of the one or more passive materials, for the particular spatial energy distribution corresponding to the longitudinal single mode and the transversal single mode, a preponderant portion of optical energy is distributed transversally apart from the active material along the entire length of the at least one active material and of the one or more passive materials, and
a spectral linewidth for the laser resonator is less than 530 kHz.

18. The laser device as described in claim 17, further comprising a heat sink component attached to the semiconductor die and configured therewith for removing heat generated in the active material from the laser resonator.

19. The laser device as described in claim 18 wherein the heat sink is attached to the semiconductor die with an epitaxial-side-down configuration in relation to the active material of the laser resonator.

20. The laser device as described in claim 17, further comprising a detector component attached to the semiconductor die and configured therewith for determining an output characteristic of the laser resonator.

21. The laser device as described in claim 20 wherein the determining an output characteristic comprises measuring a component of the resonator output relating to frequency noise of the resonator output comprises:
computing a high frequency noise spectrum of the resonator output; and
suppressing measurement of low frequency fluctuations of the resonator output.

22. A method for lasing, comprising:
amplifying light associated with an optical gain in at least one active material of an optical resonator; and
distributing spatial energy within the optical resonator wherein one or more passive materials are disposed in proximity with the at least one active material, wherein the one or more passive materials comprise:
a low loss material for storing optical energy of the preponderant portion distributed apart from the active material, the low loss material comprising a grating resonator comprising a pattern of holes, the grating resonator having a quality factor Q of at least $10^4$; and
a mode control layer disposed between the low loss material and the at least one active material for controlling a ratio of the optical energy stored in the low loss material to a portion of the optical energy in the active material,
wherein:
a thickness of the mode control layer and the quality factor Q of the grating resonator are configured to result in a low phase noise for the optical resonator device,
the at least one active material and the one or more passive materials overlap and extend in a longitudinal direction for a same length along a laser beam emission direction,
the optical resonator oscillates over a single optical mode in the longitudinal direction and a single optical mode in a transversal direction perpendicular to the longitudinal direction, the longitudinal single mode and the transversal single mode corresponding to a particular spatial energy distribution and resonant frequency,
based on a characteristic of the one or more passive materials, for the particular spatial energy distribution corresponding to the longitudinal single mode and the transversal single mode, a preponderant portion of optical energy is distributed transversally apart from the active material along the entire length of the at least one active material and of the one or more passive materials, and a spectral linewidth for the optical resonator is less than 530 kHz.

23. A system for lasing, comprising:

means for amplifying light associated with an optical gain in at least one active material of an optical resonator; and means for distributing spatial energy within the optical resonator wherein one or more passive materials are disposed in proximity with the at least one active material, wherein the one or more passive materials comprise:

a low loss material for storing optical energy of the preponderant portion distributed apart from the active material, the low loss material comprising a grating resonator comprising a pattern of holes, the grating resonator having a quality factor Q of at least $10^4$; and a mode control layer disposed between the low loss material and the at least one active material for controlling a ratio of the optical energy stored in the low loss material to a portion of the optical energy in the active material, wherein:

a thickness of the mode control layer and the quality factor Q of the grating resonator are configured to result in a low phase noise for the laser resonator device, the at least one active material and the one or more passive materials overlap and extend in a longitudinal direction for a same length along a laser beam emission direction, the optical resonator oscillates over a single optical mode in the longitudinal direction and a single optical mode in a transversal direction perpendicular to the longitudinal direction, the longitudinal single mode and the transversal single mode corresponding to a particular spatial energy distribution and resonant frequency, based on a characteristic of the one or more passive materials, for the particular spatial energy distribution corresponding to the longitudinal single mode and the transversal single mode, a preponderant portion of optical energy is distributed transversally apart from the active material along the entire length of the at least one active material and of the one or more passive materials, and a spectral linewidth for the optical resonator is less than 530 kHz.

24. A method for fabricating a laser resonator, the method comprising:

disposing one or more passive materials on a semiconductor substrate;

disposing at least one active material in proximity with the one or more passive materials wherein light is amplified in the at least one active material, the at least one active material and the one or more passive materials overlapping and extending in a longitudinal direction for a same length along a laser beam emission direction, wherein the one or more passive materials comprise:

a low loss material for storing optical energy of the preponderant portion distributed apart from the active material, the low loss material comprising a grating resonator comprising a pattern of holes, the grating resonator having a quality factor Q of at least $10^4$; and a mode control layer disposed between the low loss material and the at least one active material for controlling a ratio of the optical energy stored in the low loss material to a portion of the optical energy in the active material;

controlling a thickness of the mode control layer to transversely distribute the preponderant portion of the optical energy apart from the active material, and controlling a thickness of the mode control layer and the quality factor Q of the grating resonator to result in a low phase noise for the laser resonator device;

wherein:

the laser resonator oscillates over a single optical mode in the longitudinal direction and a single optical mode in a transversal direction perpendicular to the longitudinal direction, the longitudinal single mode and the transversal single mode corresponding to a particular spatial energy distribution and resonant frequency, based on a characteristic of the one or more passive materials, for the particular spatial energy distribution corresponding to the longitudinal single mode and the transversal single mode, a preponderant portion of optical energy is distributed transversally apart from the active material along the entire length of the at least one active material and of the one or more passive materials, and a spectral linewidth for the laser resonator is less than 530 kHz.

25. The method of claim 24, wherein the mode control layer is silicon dioxide.

26. The method of claim 24, further comprising reducing noise of the laser resonator based on controlling a thickness of the mode control layer.

27. A laser resonator fabricated by process steps comprising:

disposing one or more passive materials on a semiconductor substrate; and disposing at least one active material in proximity with the one or more passive materials wherein light, associated with an optical gain of the laser resonator, is amplified in the at least one active material, wherein the one or more passive materials comprise:

a low loss material for storing optical energy of the preponderant portion distributed apart from the active material, the low loss material comprising a grating resonator comprising a pattern of holes, the grating resonator having a quality factor Q of at least $10^4$; and a mode control layer disposed between the low loss material and the at least one active material for controlling a ratio of the optical energy stored in the low loss material to a portion of the optical energy in the active material, wherein:

a thickness of the mode control layer and the quality factor Q of the grating resonator are configured to result in a low phase noise for the laser resonator device, the at least one active material and the one or more passive materials overlap and extend in a longitudinal direction for a same length along a laser beam emission direction, the laser resonator oscillates over a single optical mode in the longitudinal direction and a single optical mode in a transversal direction perpendicular to the longitudinal direction, the longitudinal single mode and the transversal single mode corresponding to a particular spatial energy distribution and resonant frequency, based on a characteristic of the one or more passive materials, for the particular spatial energy distribution corresponding to the longitudinal single mode and the transversal single mode, a preponderant portion of optical energy is distributed transversally apart from the active material along the entire length of the at least one active material and of the one or more passive materials, and a spectral linewidth for the laser resonator is less than 530 kHz.

28. The laser resonator as described in claim 27, wherein the laser device comprises one or more of a heat sink component or a detector component.

29. The laser resonator as described in claim 27, wherein the configured pattern of holes comprises:

an array of holes of different size; and a defect disposed within the array of holes.

30. The laser resonator as described in claim 29, wherein the array of holes of different size comprises longitudinal slot holes that increase in length from an edge of the array to the center of the array.

31. The laser resonator as described in claim 30, wherein the at least one active material is shaped as a mesa structure and the low loss material configured with a pattern of holes extends laterally beyond the mesa structure.

* * * * *